United States Patent
Kim et al.

(10) Patent No.: US 10,685,972 B2
(45) Date of Patent: Jun. 16, 2020

(54) SEMICONDUCTOR MEMORY DEVICES AND METHODS FOR FABRICATING THE SAME

(71) Applicants: Sunggil Kim, Yongin-si (KR); Phil Ouk Nam, Suwon-si (KR); Gukhyon Yon, Hwaseong-si (KR); Sunghae Lee, Suwon-si (KR); Woojin Jang, Suwon-si (KR); Dongchul Yoo, Seongnam-si (KR); Hunhyeong Lim, Hwaseong-si (KR); Junggeun Jee, Seoul (KR); Kihyun Hwang, Seongnam-si (KR)

(72) Inventors: Sunggil Kim, Yongin-si (KR); Phil Ouk Nam, Suwon-si (KR); Gukhyon Yon, Hwaseong-si (KR); Sunghae Lee, Suwon-si (KR); Woojin Jang, Suwon-si (KR); Dongchul Yoo, Seongnam-si (KR); Hunhyeong Lim, Hwaseong-si (KR); Junggeun Jee, Seoul (KR); Kihyun Hwang, Seongnam-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/514,239

(22) PCT Filed: Sep. 26, 2014

(86) PCT No.: PCT/IB2014/064848
§ 371 (c)(1),
(2) Date: Mar. 24, 2017

(87) PCT Pub. No.: WO2016/046602
PCT Pub. Date: Mar. 31, 2016

(65) Prior Publication Data
US 2017/0287929 A1      Oct. 5, 2017

(51) Int. Cl.
H01L 27/11582  (2017.01)
H01L 27/11568  (2017.01)
(Continued)

(52) U.S. Cl.
CPC .... H01L 27/11582 (2013.01); H01L 21/0206 (2013.01); H01L 21/31116 (2013.01);
(Continued)

(58) Field of Classification Search
CPC .................... H01L 27/11582; H01L 27/11568
See application file for complete search history.

(56) References Cited

U.S. PATENT DOCUMENTS 7,956,408 B2  6/2011  Enda et al.
8,309,405 B2  11/2012  Yang et al.
(Continued)

FOREIGN PATENT DOCUMENTS

| CN | 101847602 A | 9/2010 |
|---|---|---|
| KR | 10-2010-0024096 A | 3/2010 |
| KR | 10-2013-0086778 A | 8/2013 |

OTHER PUBLICATIONS

Wolf, S. "Microchip Manufacturing" copyright 2004 pp. 402-405.*

*Primary Examiner* — Grant S Withers
(74) *Attorney, Agent, or Firm* — Lee IP Law, PC

(57) ABSTRACT

The inventive concepts provide semiconductor memory devices and methods for fabricating the same. The semiconductor memory device may include a plurality of gates vertically stacked on a substrate, a vertical channel filling a channel hole vertically penetrating the plurality of gates, and a memory layer vertically extending on an inner sidewall of the channel. The vertical channel may include a lower channel filling a lower region of the channel hole and electrically connected to the substrate, and an upper channel filling an upper region of the channel hole and contacting the (Continued)

lower channel. The upper channel may extend along the memory layer and the lower channel in the upper region of the channel hole and may have a uniform thickness.

19 Claims, 30 Drawing Sheets

(51) Int. Cl.
| | |
|---|---|
| H01L 21/28 | (2006.01) |
| H01L 27/115 | (2017.01) |
| H01L 49/02 | (2006.01) |
| H01L 21/02 | (2006.01) |
| H01L 21/311 | (2006.01) |
| H01L 27/1157 | (2017.01) |
| H01L 29/10 | (2006.01) |

(52) U.S. Cl.
CPC ........ H01L 27/115 (2013.01); H01L 27/1157 (2013.01); H01L 28/00 (2013.01); H01L 29/1037 (2013.01); H01L 29/40117 (2019.08)

(56) References Cited

U.S. PATENT DOCUMENTS

| | | | |
|---|---|---|---|
| 8,344,385 B2 | 1/2013 | Kim et al. | |
| 9,793,292 B2* | 10/2017 | Lee | H01L 27/11582 |
| 2010/0163968 A1 | 7/2010 | Kim et al. | |
| 2010/0178755 A1 | 7/2010 | Lee et al. | |
| 2011/0233648 A1* | 9/2011 | Seol | H01L 21/32137 |
| | | | 257/324 |
| 2012/0068255 A1* | 3/2012 | Lee | H01L 27/11582 |
| | | | 257/324 |
| 2012/0112264 A1* | 5/2012 | Lee | H01L 27/11551 |
| | | | 257/324 |
| 2012/0205722 A1 | 8/2012 | Lee et al. | |
| 2012/0276696 A1 | 11/2012 | Yang et al. | |
| 2013/0134492 A1* | 5/2013 | Yang | H01L 27/1157 |
| | | | 257/314 |
| 2013/0161731 A1 | 6/2013 | Bin et al. | |
| 2014/0070302 A1* | 3/2014 | Yoo | H01L 27/1157 |
| | | | 257/324 |
| 2014/0199815 A1 | 7/2014 | Hwang et al. | |
| 2015/0061155 A1* | 3/2015 | Seo | H01L 29/16 |
| | | | 257/774 |
| 2015/0115348 A1* | 4/2015 | Nam | H01L 27/11582 |
| | | | 257/324 |
| 2015/0132915 A1* | 5/2015 | Park | H01L 29/66833 |
| | | | 438/287 |
| 2015/0200203 A1* | 7/2015 | Jang | H01L 27/11582 |
| | | | 257/324 |
| 2015/0279857 A1* | 10/2015 | Kim | H01L 27/11582 |
| | | | 438/269 |
| 2015/0318301 A1* | 11/2015 | Lee | H01L 29/7926 |
| | | | 257/324 |
| 2015/0380431 A1* | 12/2015 | Kanamori | H01L 27/11582 |
| | | | 257/324 |
| 2016/0005759 A1* | 1/2016 | Kim | H01L 27/11582 |
| | | | 257/314 |
| 2016/0056169 A1* | 2/2016 | Lee | H01L 27/11565 |
| | | | 438/269 |
| 2017/0110474 A1* | 4/2017 | Lee | H01L 27/11582 |
| 2017/0162578 A1* | 6/2017 | Noh | H01L 21/02323 |
| 2018/0006055 A1* | 1/2018 | Kim | H01L 27/11582 |
| 2018/0083027 A1* | 3/2018 | Yamabe | H01L 27/11582 |
| 2018/0366474 A1* | 12/2018 | Kim | H01L 29/7926 |

\* cited by examiner

SEMICONDUCTOR MEMORY DEVICES AND METHODS FOR FABRICATING THE SAME

TECHNICAL FIELD

The inventive concepts relate to a semiconductor and, more particularly, to semiconductor memory devices and methods for fabricating the same.

BACKGROUND ART

Semiconductor devices are widely used in an electronic industry because of their small size, multi-function, and/or low fabrication costs. High-performance and low-cost semiconductor devices have been increasingly demanded with the development of the electronic industry. Semiconductor devices (e.g., semiconductor memory devices) have been highly integrated in order to satisfy the above demands.

An integration degree of a conventional two-dimensional (2D) memory device is mainly determined by an area occupied by a unit memory cell. Therefore, the integration degree of the conventional 2D memory device is greatly affected by a technique for forming fine patterns. However, there may be some limitations in increasing the integration degree of the semiconductor memory devices due to high costs of apparatuses used in fabrication of the semiconductor memory devices and/or difficulties of fabrication processes. Three-dimensional (3D) semiconductor devices including three-dimensionally arranged memory cells have been developed to overcome the above limitations.

DISCLOSURE

Technical Problem

Embodiments of the inventive concepts may provide semiconductor memory devices having three-dimensional (3D) structures with improved electrical characteristics and methods for fabricating the same.

Technical Solution

In one aspect, a semiconductor memory device may include: a plurality of gates vertically stacked on a substrate; a vertical channel filling a channel hole vertically penetrating the plurality of gates; and a memory layer vertically extending on an inner sidewall of the channel. The vertical channel may include: a lower channel filling a lower region of the channel hole and electrically connected to the substrate; and an upper channel filling an upper region of the channel hole and contacting the lower channel. The upper channel may extend along the memory layer and the lower channel in the upper region of the channel hole and may have a uniform thickness.

In some embodiments, the memory layer may vertically extend along the inner sidewall of the upper region of the channel hole and may horizontally extend along a top surface of the lower channel so as to include a bottom end portion having an L-shape.

In some embodiments, the top surface of the lower channel may be flat or convex toward a direction far away from the substrate.

In some embodiments, the upper channel may extend crookedly along the L-shape of the bottom end portion of the memory layer.

In some embodiments, a portion of the top surface of the lower channel may be recessed, and a bottom end portion of the upper channel may be disposed in the recessed region of the top surface of the lower channel.

In some embodiments, the lower channel may have a pillar-shape completely filling the lower region of the channel hole, and the upper channel may have a U-shaped cylindrical structure partially filling the upper region of the channel hole and having the uniform thickness.

In some embodiments, the semiconductor memory device may further include: an insulating filling layer filling an inner space of the cylindrical structure of the upper channel.

In some embodiments, the memory layer may be provided between the upper channel and the gates adjacent to the upper channel, and a gate insulating layer may be provided between the lower channel and the gates adjacent to the lower channel.

In some embodiments, the substrate under the lower channel may be recessed, and a bottom end portion of the lower channel may be disposed in the recessed region of the substrate.

In another aspect, a semiconductor memory device may include: a gate stack including at least one lower non-memory gate, a plurality of memory gates, and at least one upper non-memory gate that are vertically stacked on a substrate; an upper channel vertically penetrating the at least one upper non-memory gate and the plurality of memory gates; a lower channel vertically penetrating the at least one lower non-memory gate; and a memory layer provided between the upper channel and the at least one upper non-memory gate and between the upper channel and the plurality of memory gates. The memory layer may have an L-shaped bottom end portion contacting the lower channel, and the upper channel may extend along the memory layer and a top surface of the lower channel and may have a uniform thickness.

In some embodiments, a lower portion of the upper channel may have a crooked shape extending along the L-shaped bottom end portion of the memory layer.

In some embodiments, the upper channel and the lower channel may be connected to each other to constitute a vertical channel vertically penetrating the gate stack, and the vertical channel may be electrically connected to the substrate.

In some embodiments, the vertical channel may fill a channel hole vertically penetrating the gate stack. The lower channel may have a pillar-shape completely filling a lower region of the channel hole, and the upper channel may be a single layer having a cylindrical shape that continuously extends along an inner sidewall of an upper region of the channel hole and the top surface of the lower channel. An inner space of the cylindrical shape may be filled with an insulating layer.

In some embodiments, the memory layer may not be provided between the lower channel and the at least one lower non-memory gate.

In some embodiments, the memory layer may include: a first memory layer provided between the upper channel and the at least one upper non-memory gate and between the upper channel and the plurality of memory gates; and a second memory layer provided between the lower channel and the at least one lower non-memory gate. The second memory layer may be further provided between the first memory layer and the at least one upper non-memory gate and between the first memory layer and the plurality of memory gates.

In still another aspect, a method for fabricating a semiconductor memory device may include: forming a channel hole vertically penetrating a plurality of layers stacked on a substrate, the channel hole exposing the substrate; forming a lower channel partially filling the channel hole; forming a memory layer extending along an inner sidewall of the channel hole and a top surface of the lower channel; forming a spacer vertically extending along an the inner sidewall of the channel hole on the memory layer; etching the memory layer to expose a portion of the top surface of the lower channel by an etching process using the spacer as an etch mask; removing the spacer to expose the memory layer; and forming an upper channel extending along the exposed memory layer and the exposed portion of the top surface of the lower channel.

In some embodiments, removing the spacer may include: selectively removing the spacer by providing a gaseous etchant capable of selectively etching the spacer with respect to the memory layer.

In some embodiments, the memory layer and the spacer may include an insulating layer and a silicon layer, respectively, and the gaseous etchant may include fluorine (F), chlorine (Cl), bromine (Br), iodine (I), any compound thereof, or any combination thereof.

In some embodiments, the method may further include: trimming the upper channel.

In some embodiments, trimming the upper channel may include: thinning the upper channel by providing a solution including ammonia water ($NH_4OH$), hydrogen peroxide ($H_2O_2$), and deionized water.

Advantageous Effects

According to embodiments of the inventive concepts, since the semiconductor layer is conformally formed, the upper channel having the uniform thickness may be formed. In addition, even though the trimming process for forming a thin channel is performed, the contact characteristics between the upper and lower channels may be excellent. As a result, it is possible to improve the electrical characteristics of the 3D semiconductor memory device.

DESCRIPTION OF DRAWINGS

FIG. 2R is an enlarged cross sectional view of a portion of FIG. 2Q;

MODE FOR INVENTION

Figure 1:
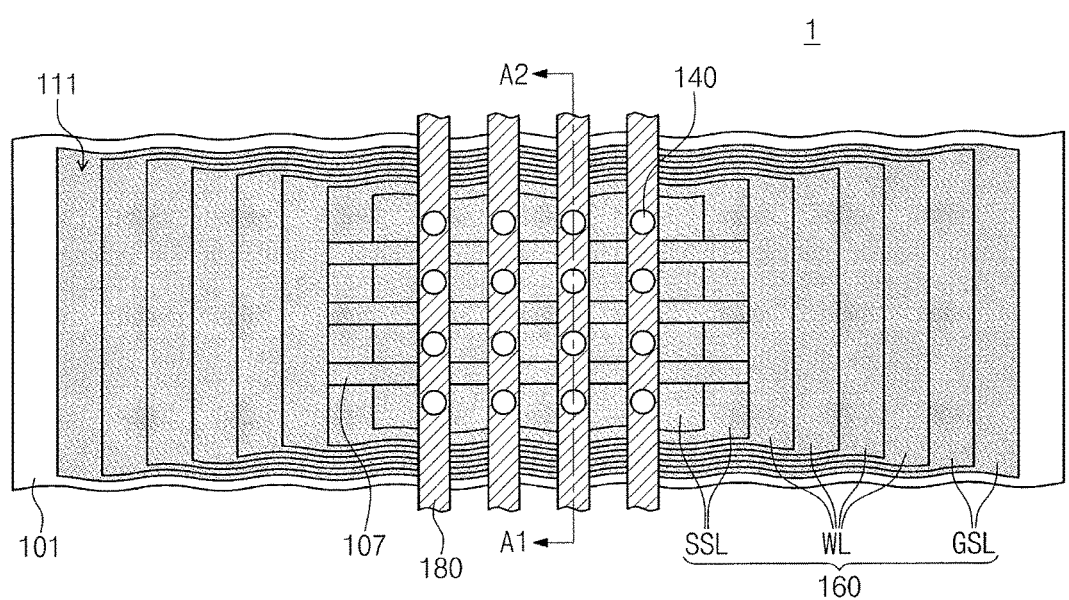
FIG. 1 is a plan view illustrating a semiconductor memory device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view illustrating a semiconductor memory device according to example embodiments of the inventive concepts.

Referring to FIG. 1, a semiconductor memory device 1 may include a plurality of vertical channels 140 standing vertically on a substrate 101, a plurality of gates 160 stacked along the vertical channels 140, and bit lines 180 electrically connected to the vertical channels 140. The semiconductor memory device 1 may be a vertical NAND flash memory device further including a memory layer 150 provided between the vertical channel 140 and the gates 160, as illustrated in FIG. 2Q.

The gates 160 may constitute a ground selection line GSL adjacent to the substrate 101, a string selection line SSL, and word lines WL between the ground selection line GSL and the string selection line SSL. The ground selection line GSL may have a single-layered or double-layered structure, and the string selection line SSL may have a single-layered or double-layered structure. A bottom end of each vertical channel 140 may be electrically connected to the substrate 101, and a top end of each vertical channel 140 may be electrically connected to the bit line 180.

The gates 160 may be stacked in a pyramid form, so two sidewalls or four sidewalls of the stacked gates 160 may form stepped structures 111. The string selection line SSL may have a linear shape extending in a direction intersecting an extending direction of the bit line 180. The extending direction of the bit line 180 may be parallel to the line A1-A2. For example, the extending direction of the string selection line SSL may be perpendicular to the line A1-A2. The word lines WL and the ground selection line GSL may have plate-shapes having a word line cut 107 extending in a direction intersecting the line A1-A2. The word line cut 107 may expose the substrate 101.

Figure 2A:
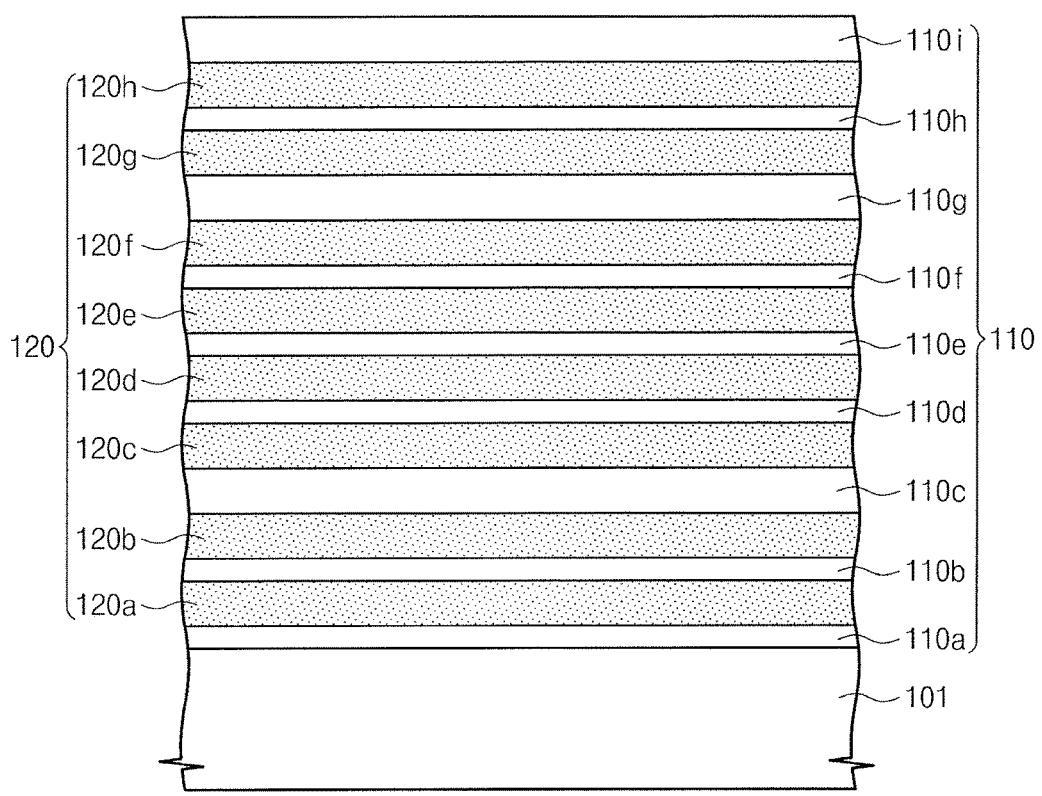
FIGS. 2A to 2R are cross-sectional views taken along a line A1-A2 of FIG. 1 to illustrate a method for fabricating a semiconductor memory device according to some embodiments of the inventive concepts.
Figure 2B:
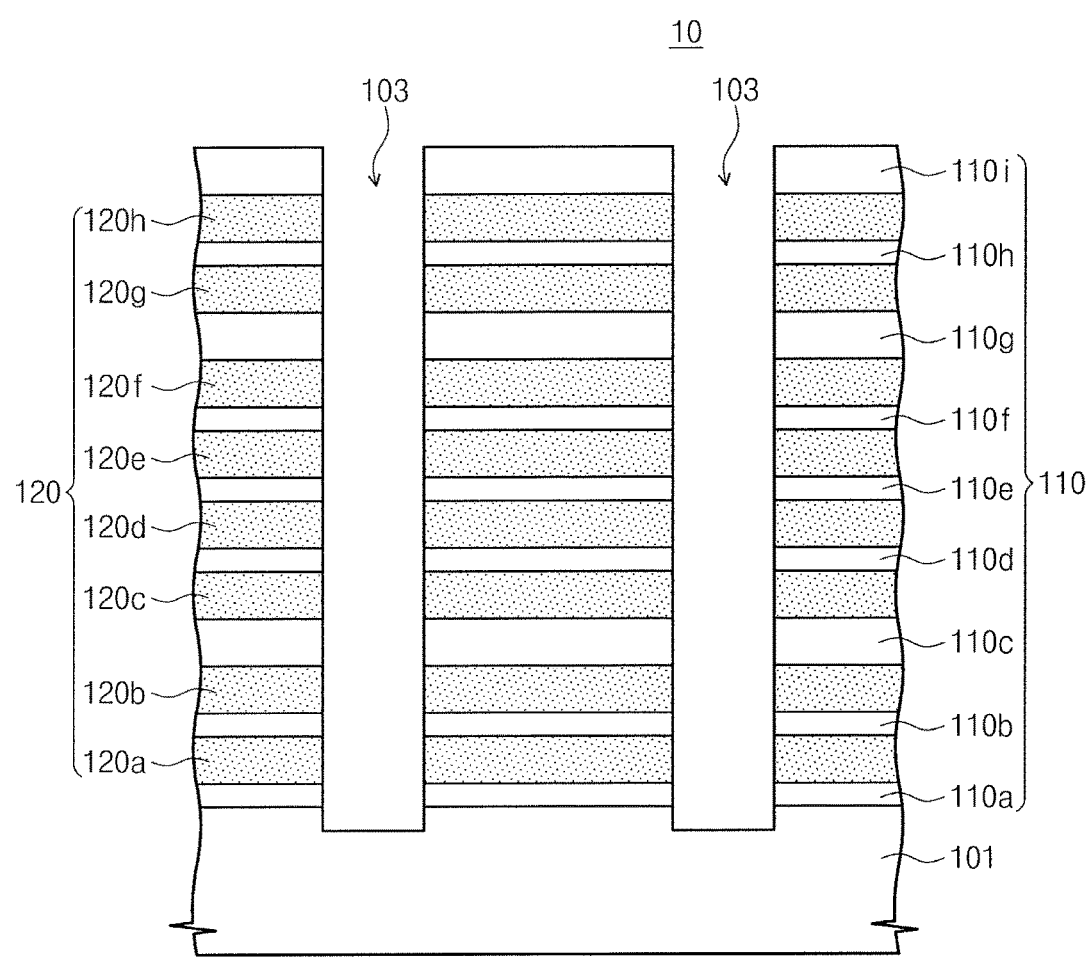
FIG. 2I is an enlarged cross sectional view of a portion of FIG. 2H.
FIG. 2K is an enlarged cross sectional view of a portion of FIG. 2J.
Figure 2C:
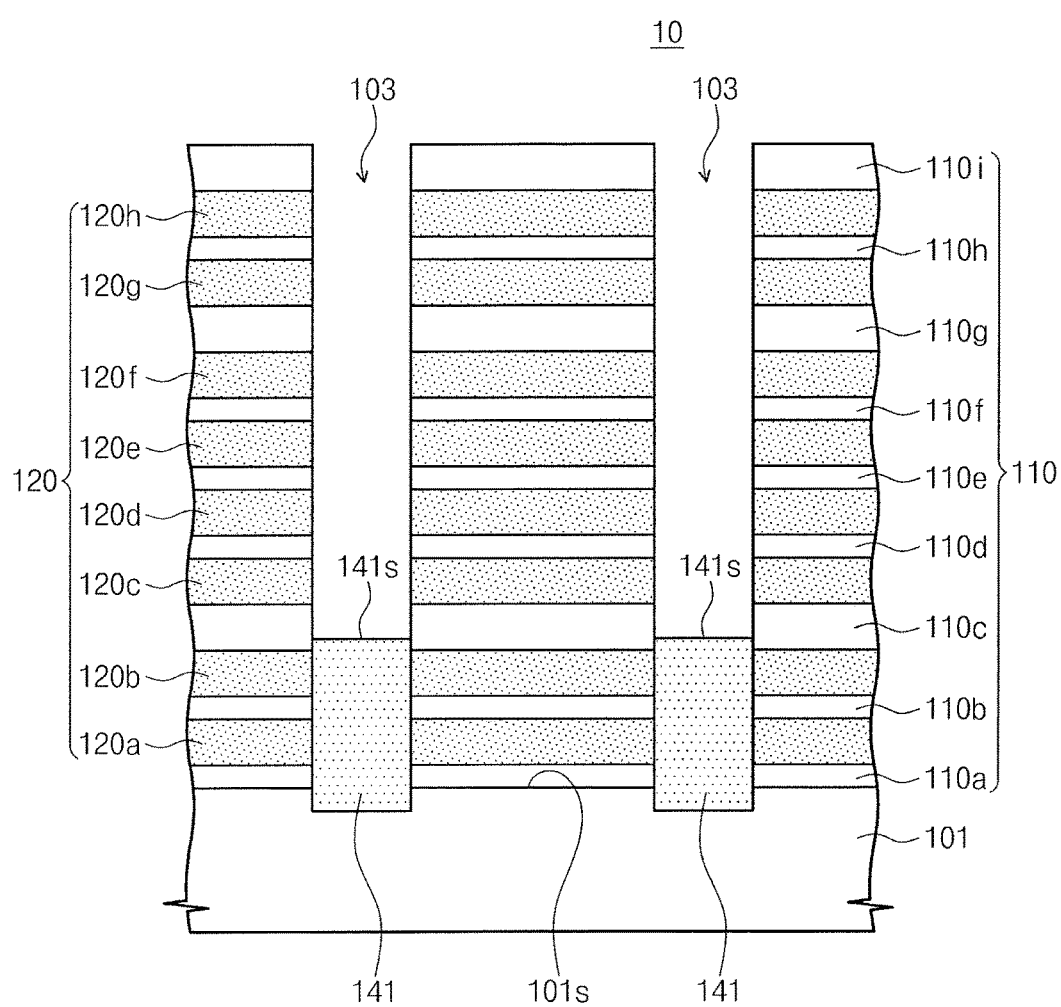
Figure 2D:
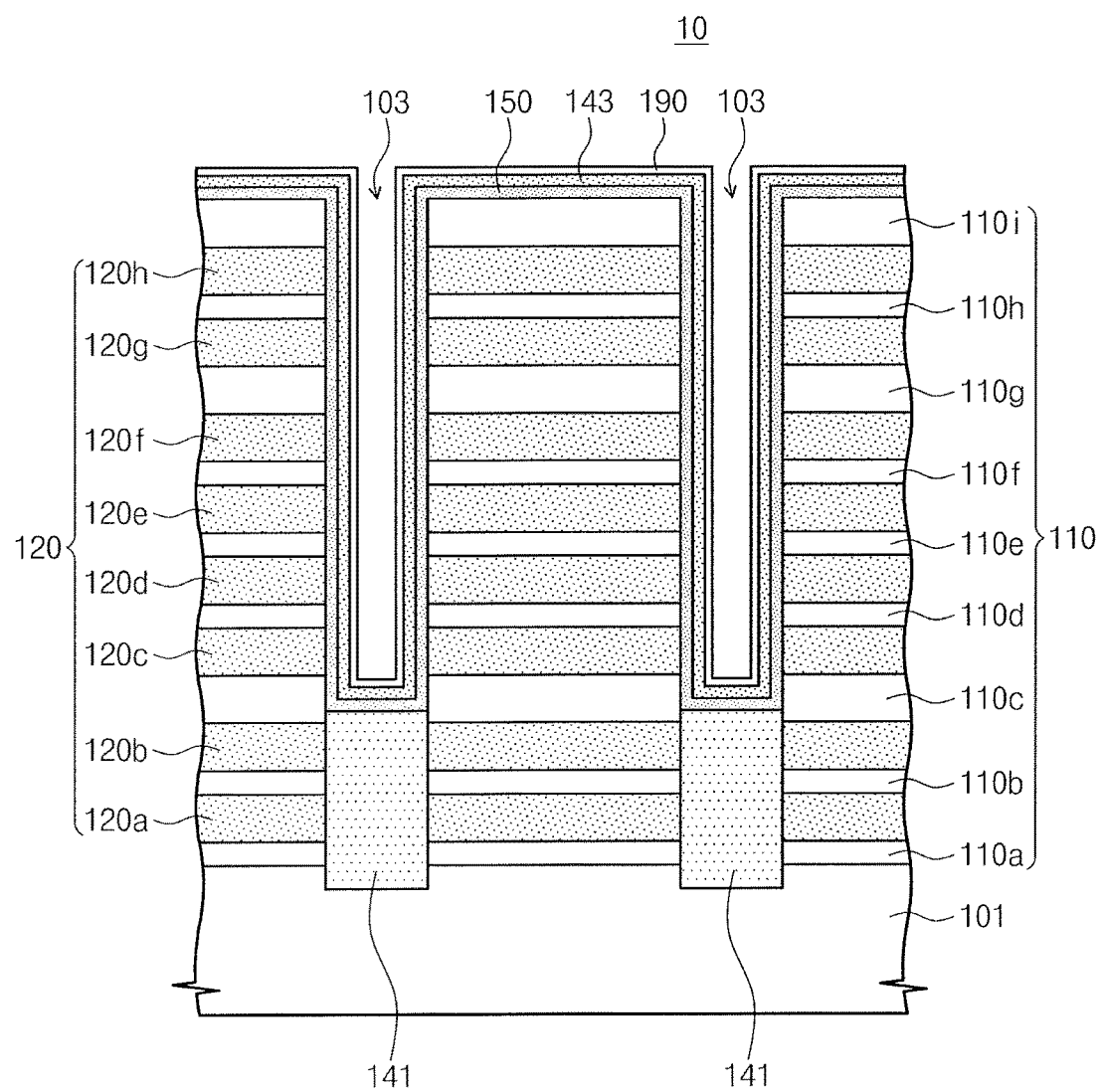
Figure 2E:
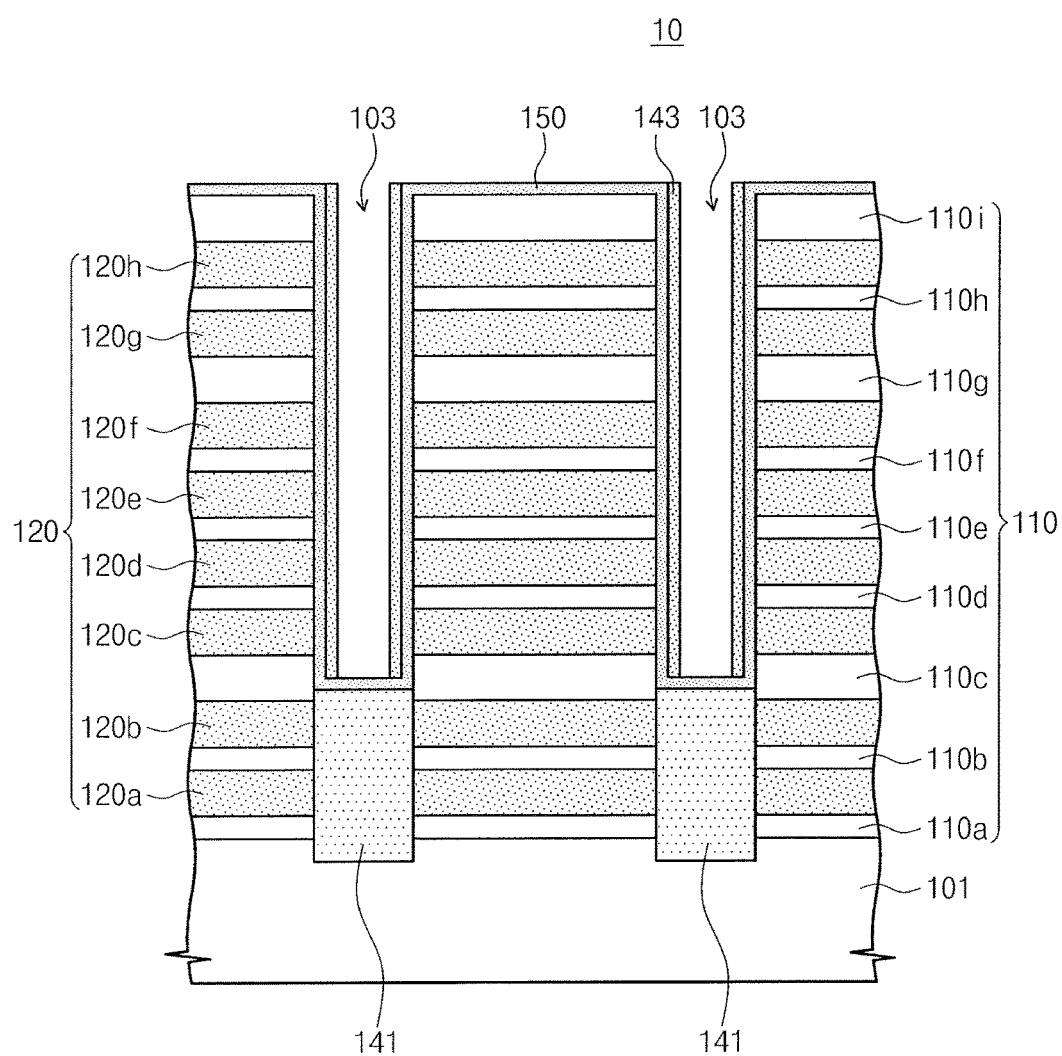
Figure 2F:
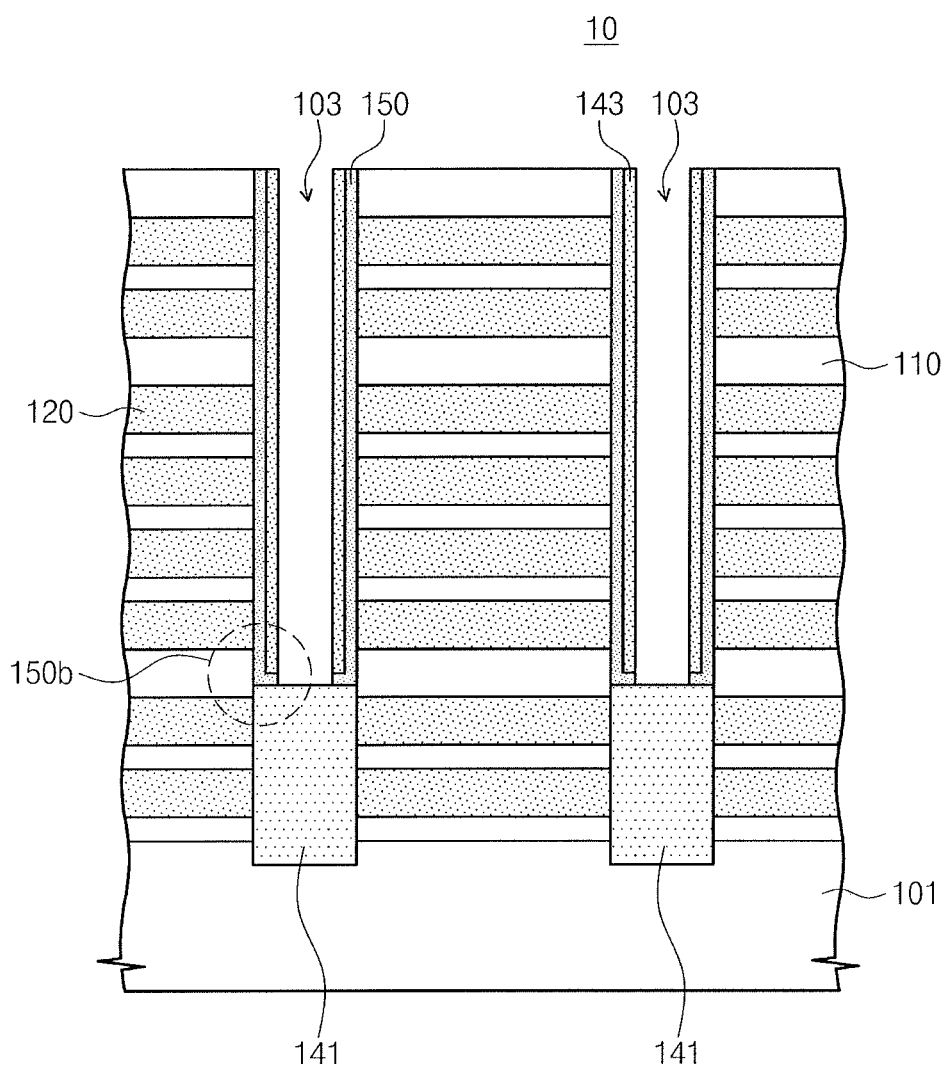
Figure 2G:
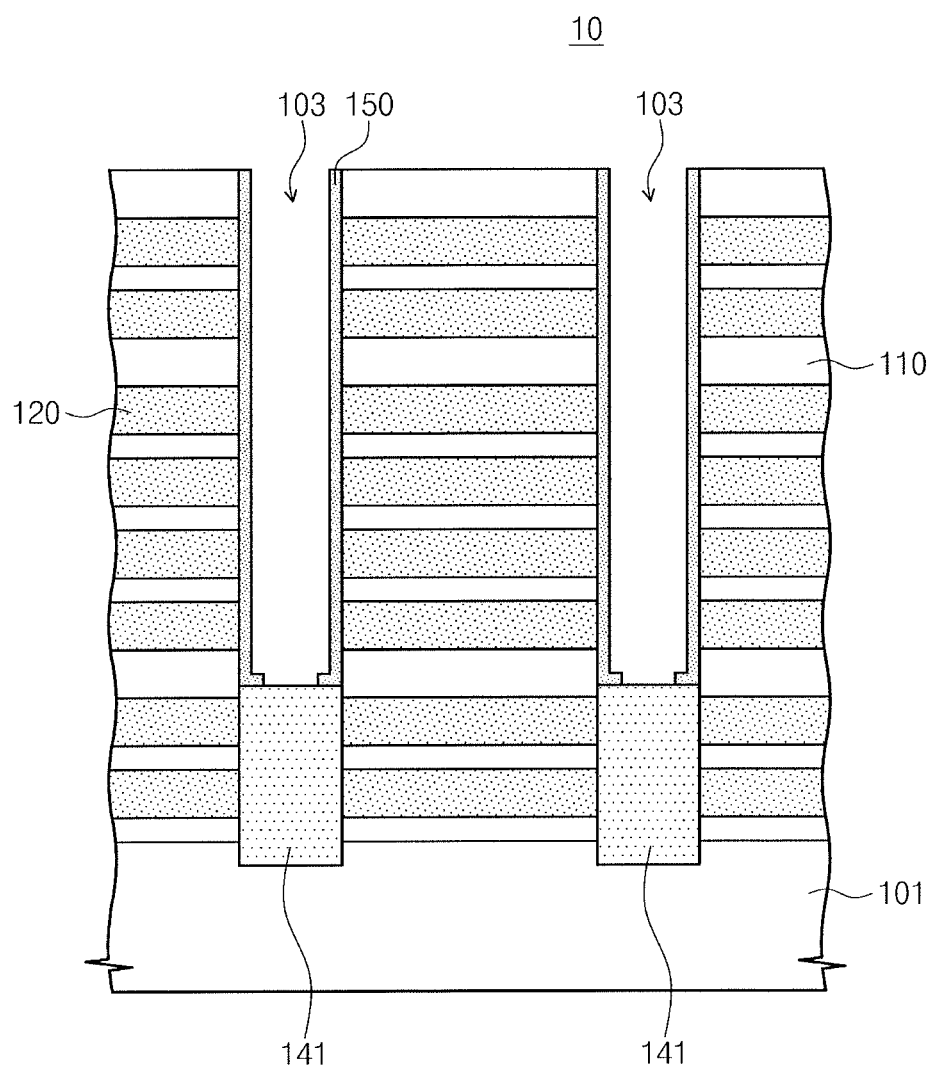
Figure 2H:
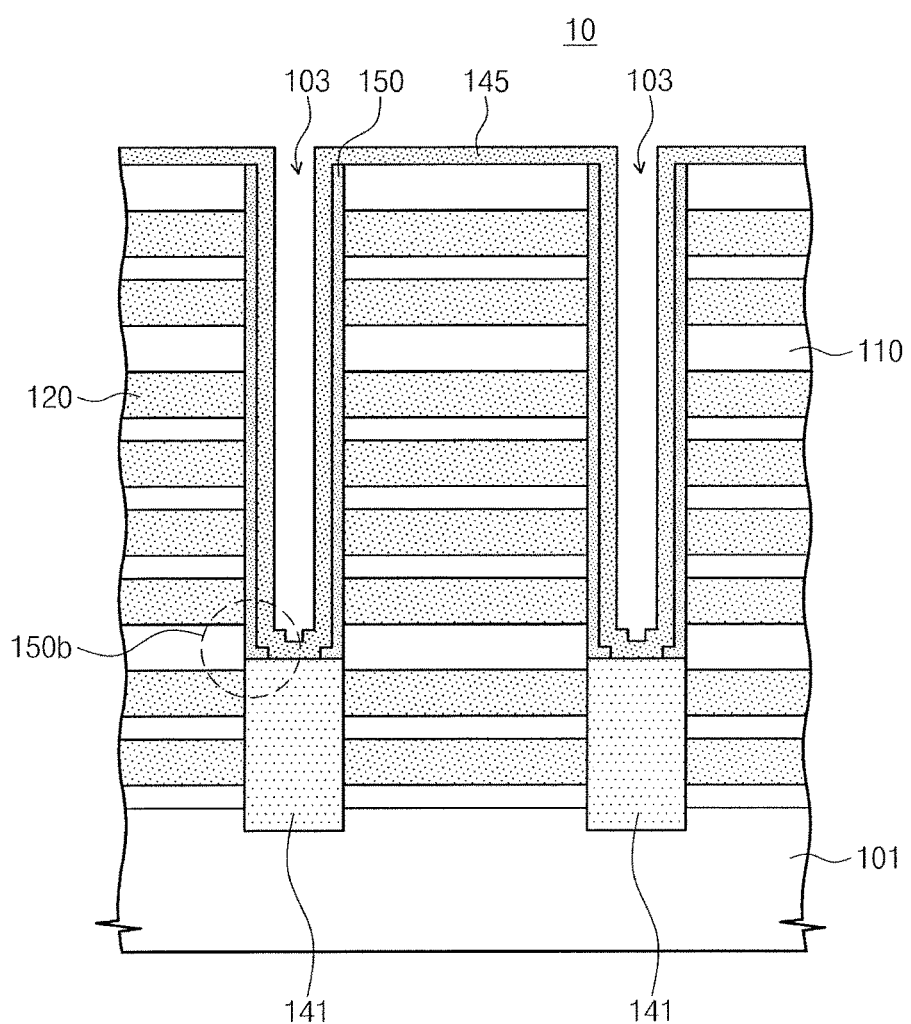
Figure 2I:
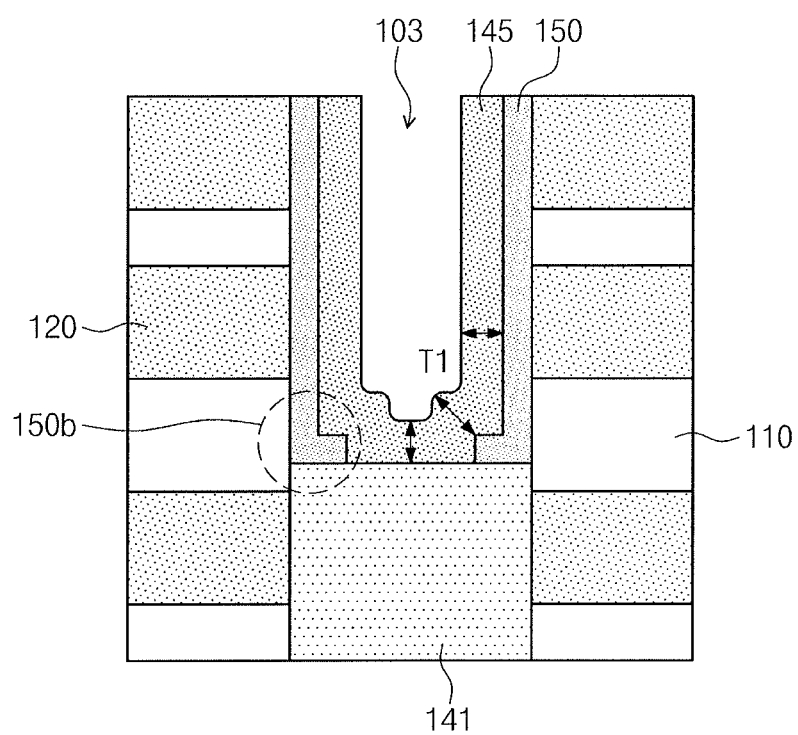
Figure 2J:
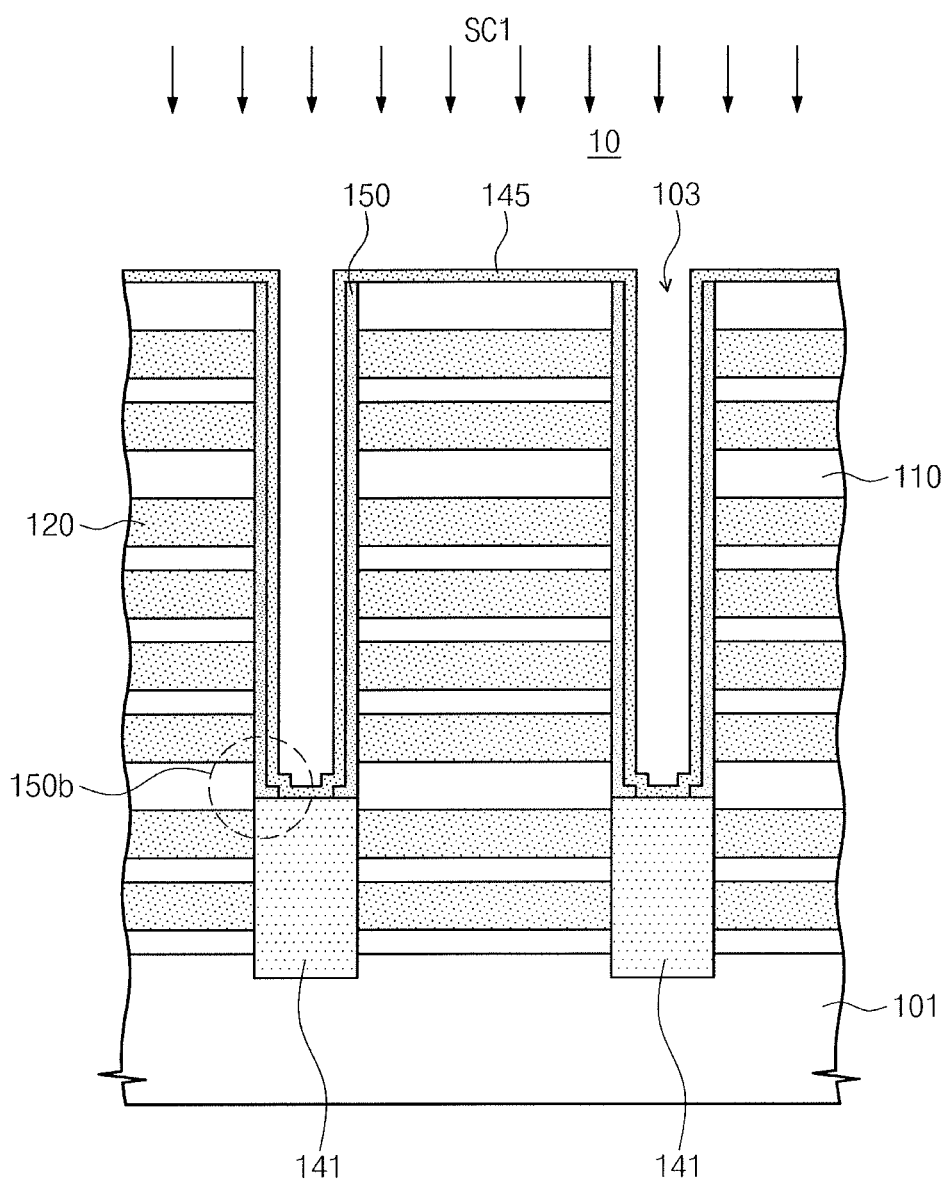
Figure 2K:
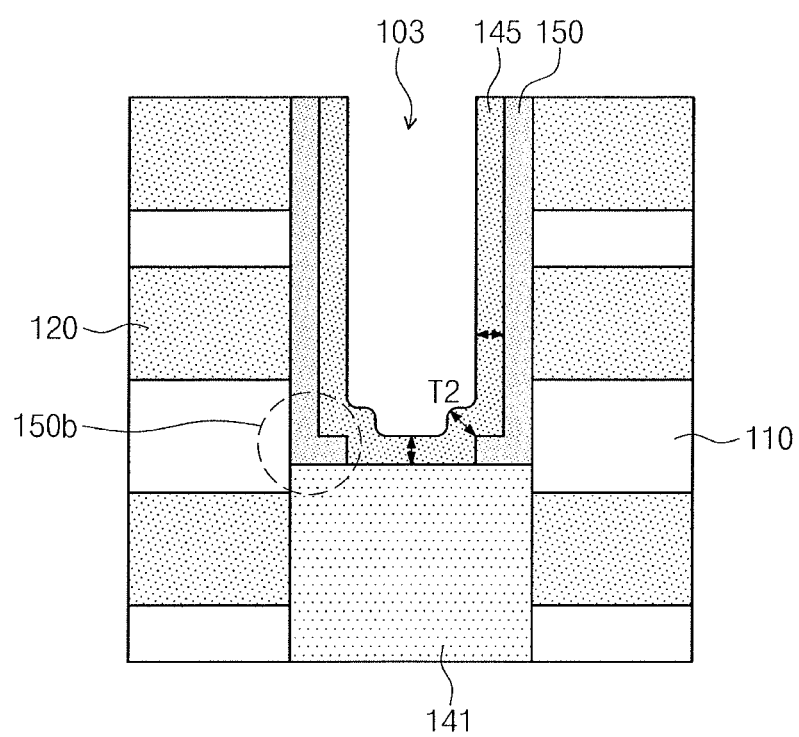
Figure 2L:
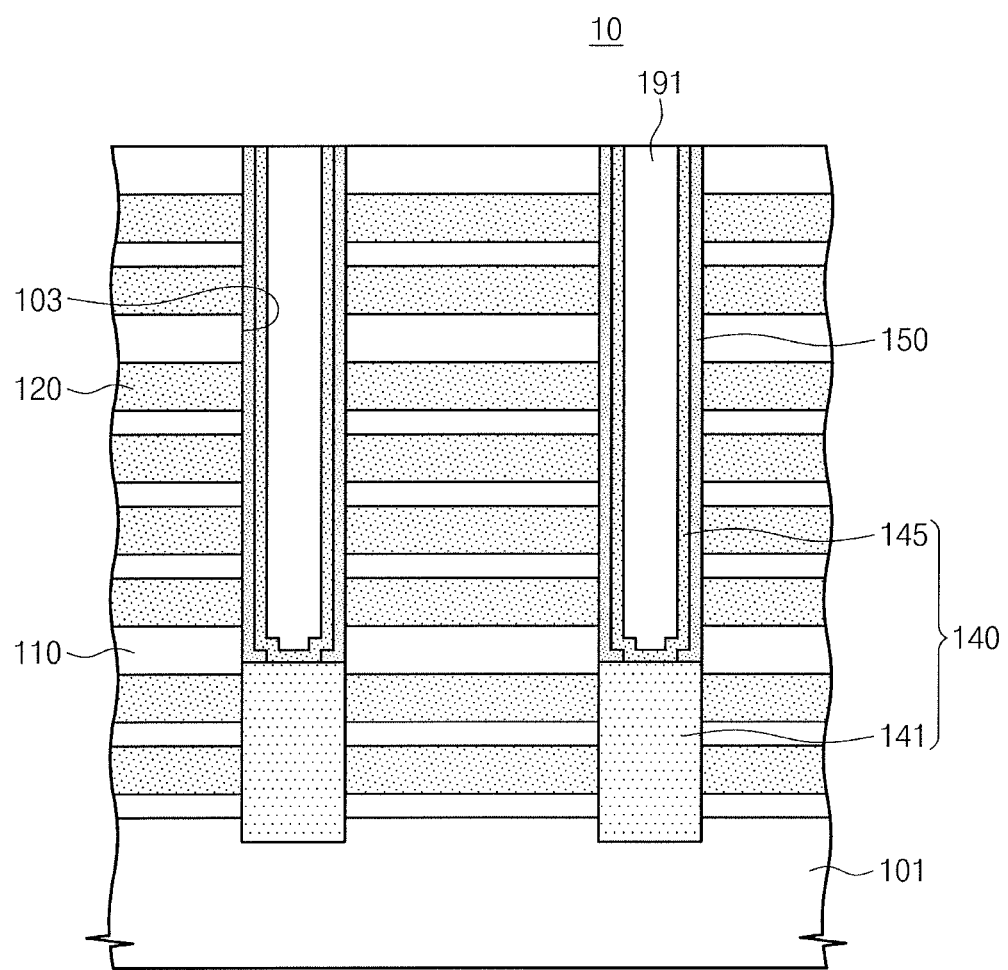
Figure 2M:
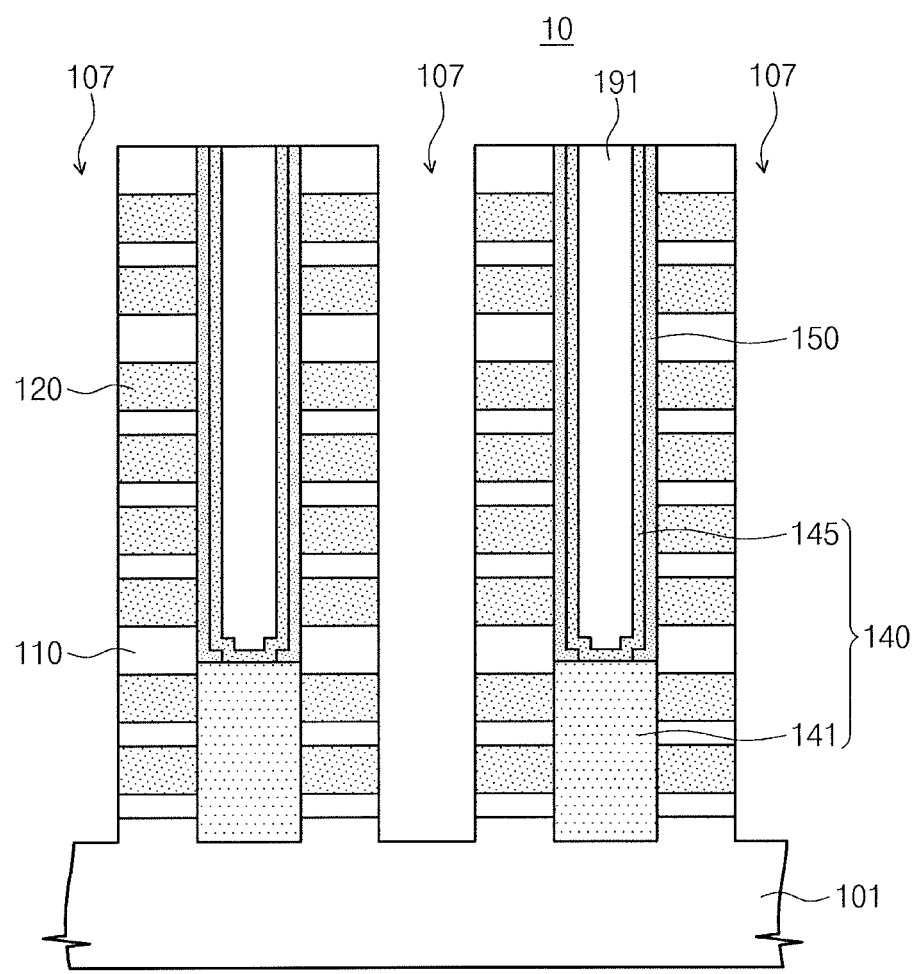
Figure 2N:
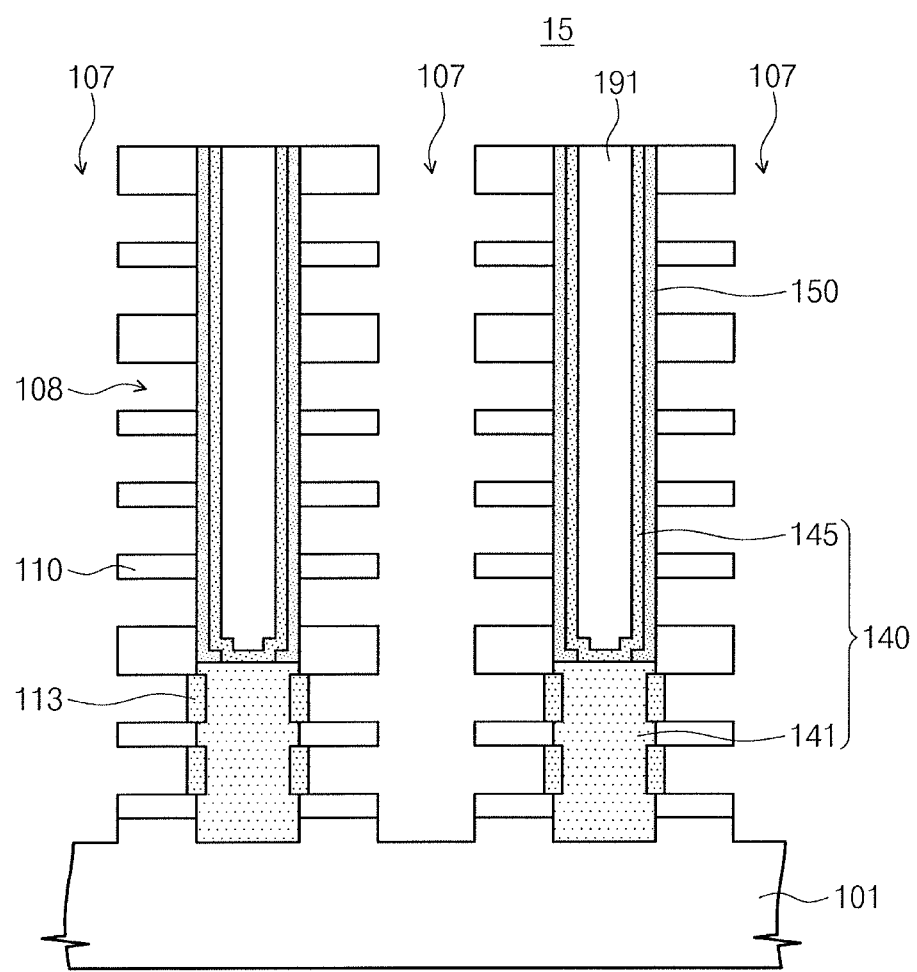
Figure 20:
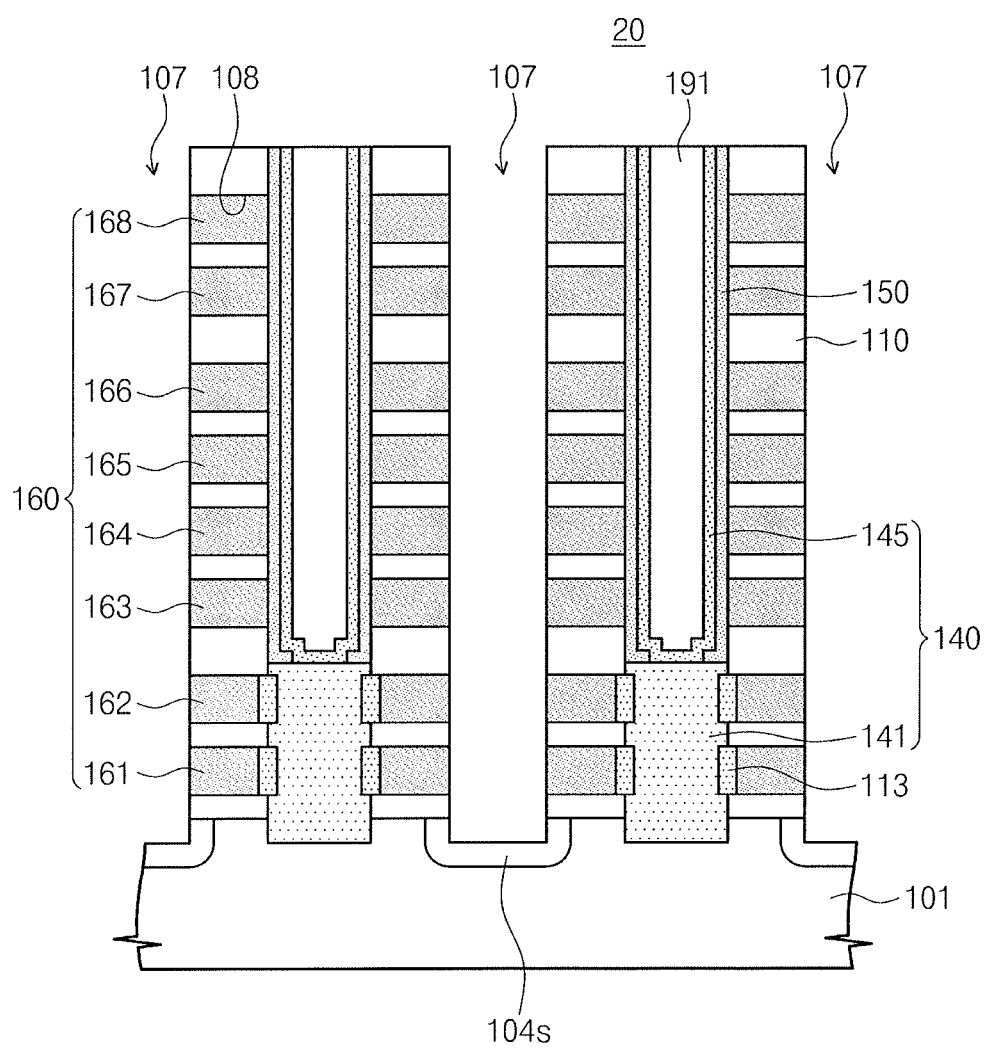
Figure 2P:
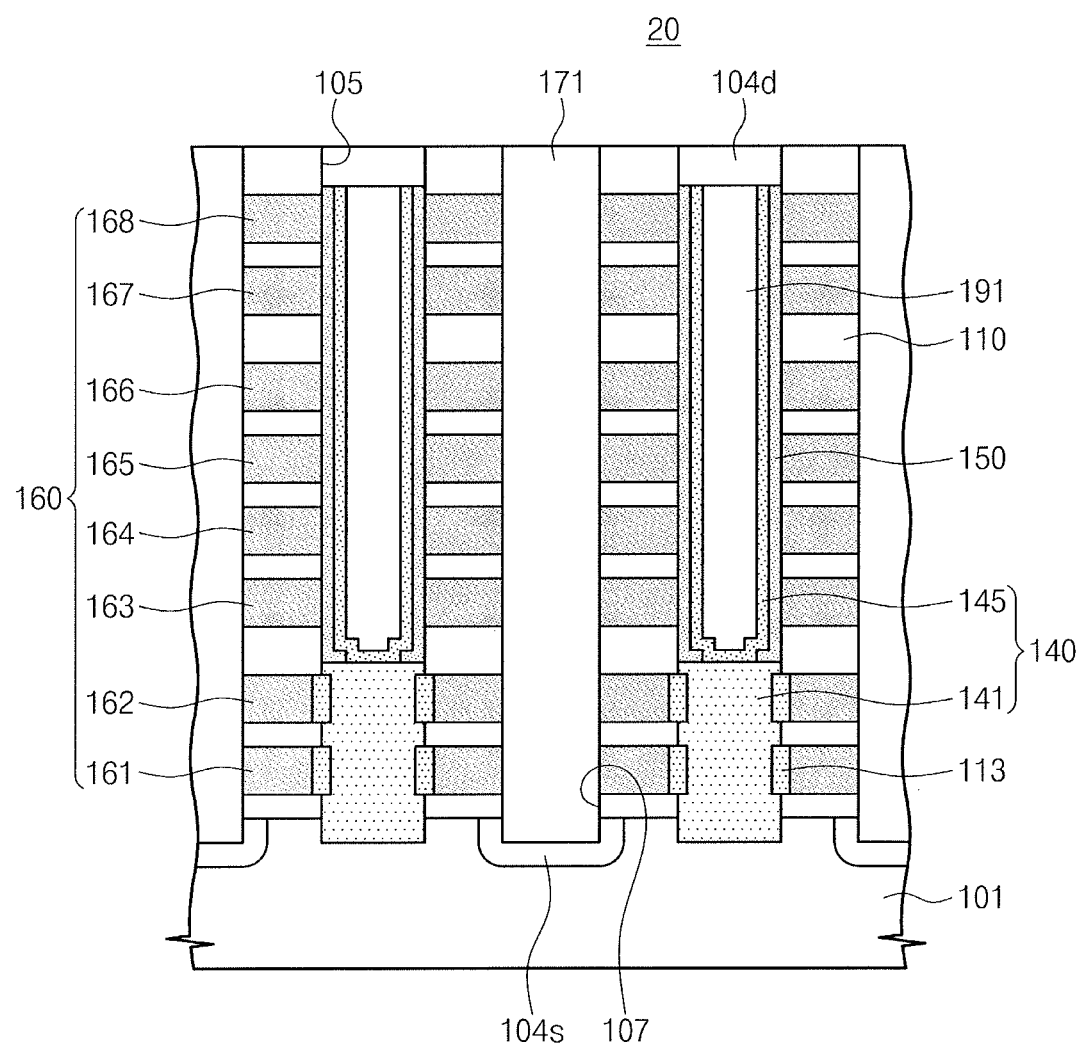
Figure 2Q:
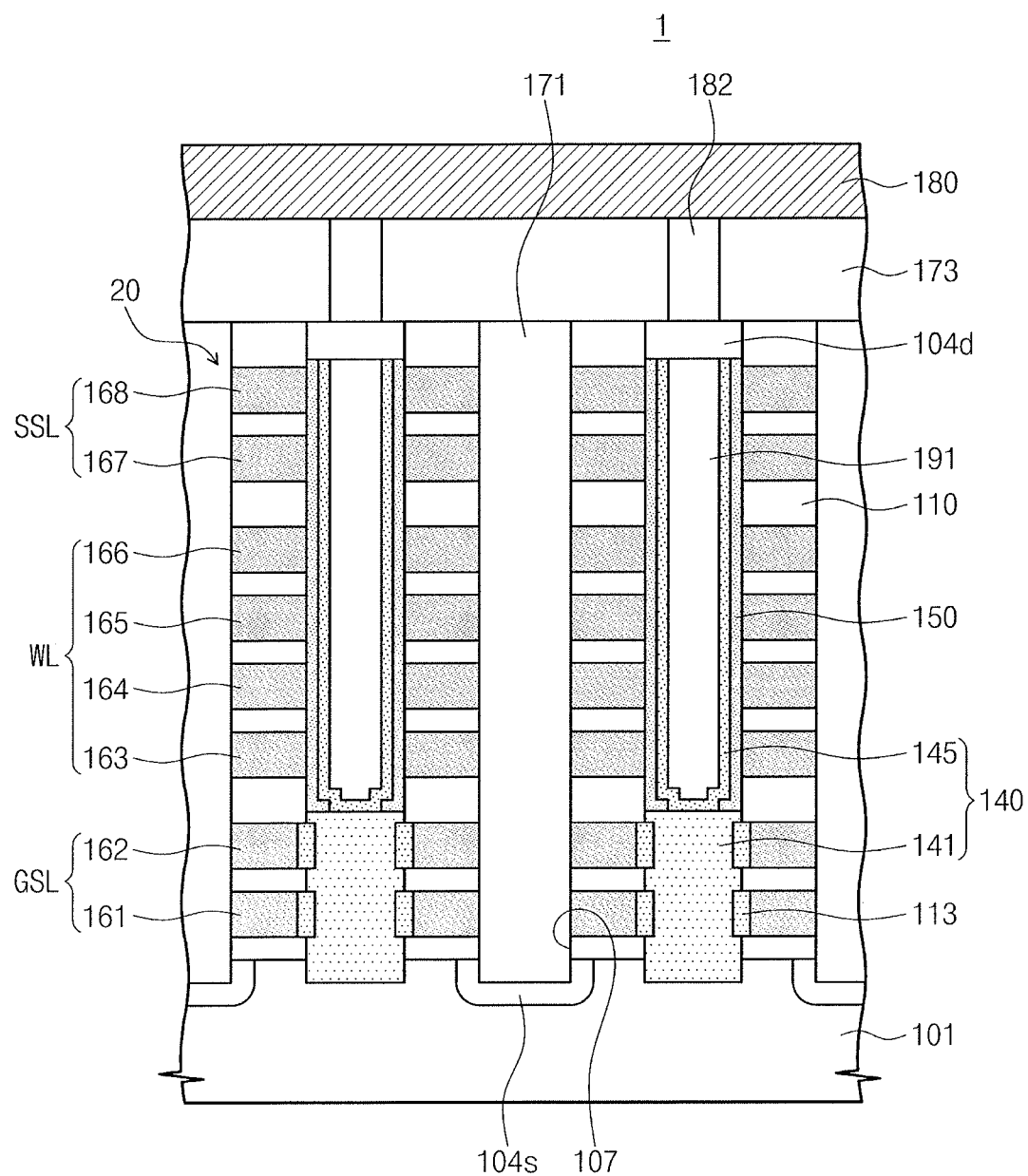

The vertical channel 140 of the semiconductor memory device 1 may include a lower channel 141 and an upper channel 145 stacked on the lower channel 141, as illustrated in FIG. 2Q. The upper channel 145 may be in contact with the lower channel 141. In some embodiments, the vertical channel 140 may have a macaroni-shape. Additionally, the vertical channel 140 may sufficiently secure a current path without a cut phenomenon between the lower and upper channels 141 and 145 even though the vertical channel 140 becomes thinned.

Figure 2R:
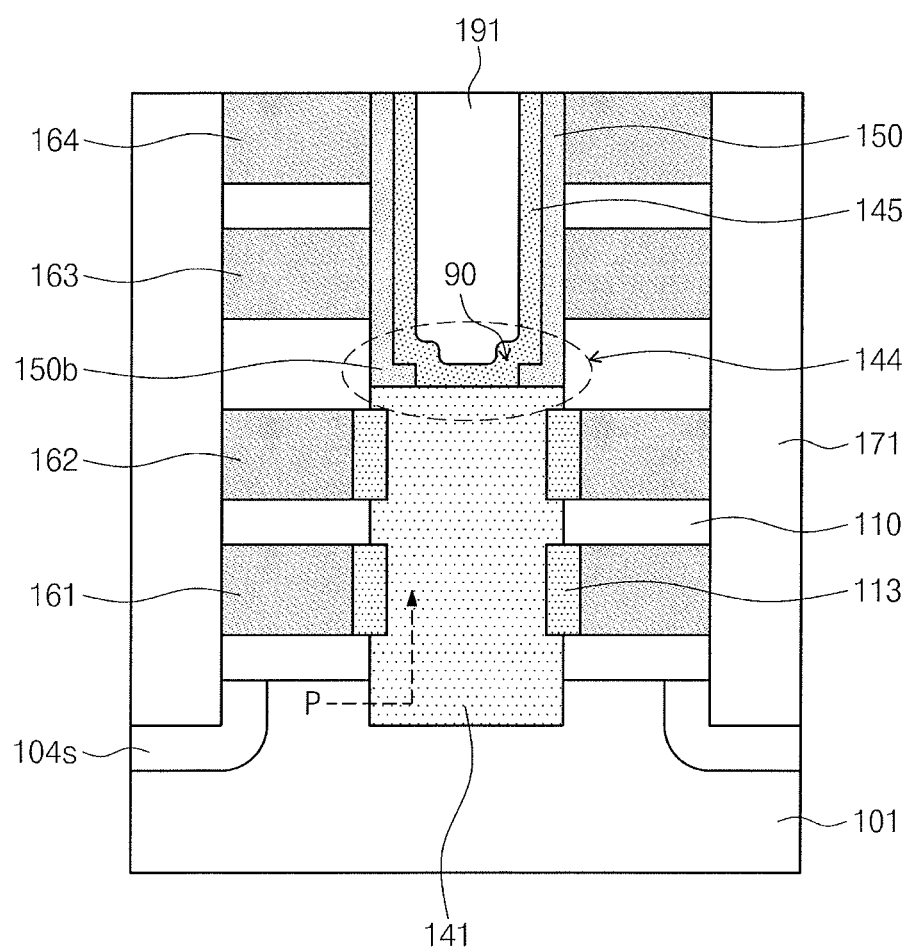
Figure 3A:
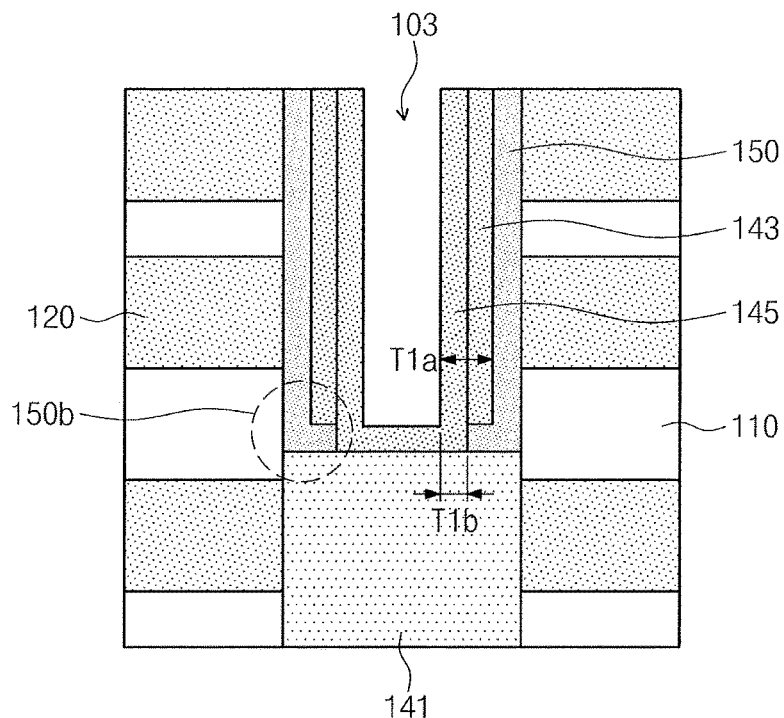
FIG. 3A is a cross-sectional view illustrating a comparison example of FIG. 2I.
Figure 3B:
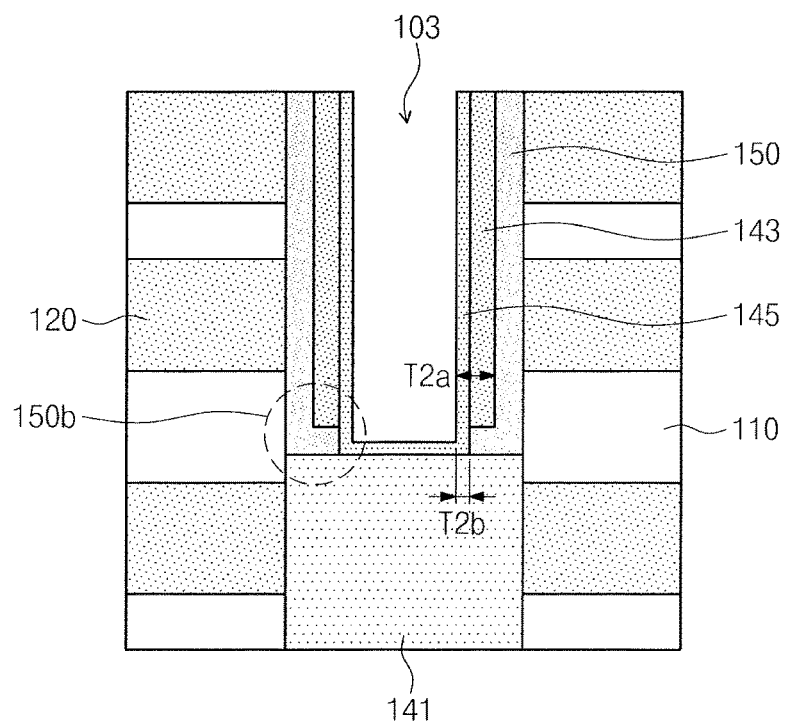
FIG. 3B is a cross-sectional view illustrating a comparison example of FIG. 2K.

FIGS. 2A to 2R are cross-sectional views taken along a line A1-A2 of FIG. 1 to illustrate a method for fabricating a semiconductor memory device according to some embodiments of the inventive concepts. FIG. 2I is an enlarged cross sectional view of a portion of FIG. 2H. FIG. 2K is an enlarged cross sectional view of a portion of FIG. 2J. FIG. 2R is an enlarged cross sectional view of a portion of FIG. 2Q. FIG. 3A is a cross-sectional view illustrating a comparison example of FIG. 2I. FIG. 3B is a cross-sectional view illustrating a comparison example of FIG. 2K.

Referring to FIG. 2A, a mold stack 10 may be formed on a substrate 101. The substrate 101 may include a semiconductor substrate such as a single-crystalline silicon wafer. A plurality of insulating layers 110 and a plurality of sacrificial layers 120 may be alternately and repeatedly stacked to form the mold stack 10. The insulating layers 110 may be silicon oxide layers or silicon nitride layers. Each of the sacrificial layers 120 may be formed of a material which has an etch selectivity with respect to the insulating layers 110 and is selected from a group consisting of silicon oxide, silicon nitride, silicon carbide, silicon, and silicon-germanium. For example, the insulating layers 110 may be silicon oxide (e.g., $SiO_x$) layers, and the sacrificial layers 120 may be silicon nitride ($SiN_x$) layers. Thicknesses of the sacrificial layers 120 may be substantially equal to each other. Thicknesses of the insulating layers 110 may be substantially equal to each other. Alternatively, the thickness of at least one of the insulating layers 110 may be different from those of others of the insulating layers 110. For example, a third insulating layer 110c and a seventh insulating layer 110g of the insulating layers 110 may be relatively thick. The insulating layers 110 may include first to ninth insulating layers 110a to 110i. The sacrificial layers 120 may include first to eighth sacrificial layers 120a to 120h.

Referring to FIG. 2B, the mold stack 10 may be patterned to form vertical channel holes 103. For example, the vertical channel holes 103 vertically penetrating the mold stack 10 may be formed by a dry etching process. The vertical channel holes 103 may expose the substrate 101. The substrate 101 may be recessed by an over-etching. A width of the vertical channel hole 103 may be substantially uniform regardless of a vertical height from the substrate 101. Alternatively, the width of the vertical channel hole 103 may be varied according to the vertical height from the substrate 101. Hereinafter, the vertical channel hole 103 having the substantially uniform width will be described as an example.

Referring to FIG. 2C, a lower channel 141 may be formed to fill a portion of the vertical channel hole 103. The lower channel 141 may be in contact with the substrate 101 and may have a pillar-shape. The lower channel 141 may be formed of a semiconductor having the same conductivity type as the substrate 101 or an intrinsic semiconductor. For example, the lower channel 141 may include P-type silicon or intrinsic silicon. The lower channel 141 may be formed of a poly-crystalline semiconductor by a deposition technique or may be formed of a single-crystalline semiconductor by an epitaxial growth technique or a laser crystallization technique. In some embodiments, the lower channel 141 may be formed by an epitaxial growth of a single-crystalline P-type silicon or intrinsic silicon. The lower channel 141 may be in contact with sidewalls of the first and second sacrificial layers 120a and 120b. Additionally, the lower channel 141 may further be in contact with a portion of a sidewall of the third insulating layer 110c. A top surface 141s of the lower channel 141 may be flat. If the substrate 101 is recessed during the formation of the vertical channel hole 103, a bottom end portion of the lower channel 141 may be disposed in the recessed region of the substrate 101, and thus, a bottom surface of the lower channel 141 may be lower than a top surface 101s of the substrate 101.

Referring to FIG. 2D, a memory layer 150 and a first semiconductor layer 143 may be formed on the substrate 101. The memory layer 150 may extend along an inner sidewall of the vertical channel hole 103 to cover the mold stack 10. The first semiconductor layer 143 may cover the memory layer 150. The memory layer 150 may include insulating layers which are deposited using a chemical vapor deposition (CVD) process or an atomic layer deposition (ALD) process and are in contact with the lower channel 141. For example, a blocking insulating layer (e.g., $SiO_2$ or $SiO_2/Al_2O_3$), a trap insulating layer (e.g., SiN or SiON), and a tunnel insulating layer (e.g., $SiO_2$) may be sequentially deposited to form the memory layer 150. The first semiconductor layer 143 may be formed of a semiconductor (e.g., poly-crystalline or single-crystalline silicon) by a CVD process or an ALD process. For example, the first semiconductor layer 143 may be formed of poly-crystalline silicon by the CVD process. In some embodiments, an insulating layer 190 may further be formed to cover the first semiconductor layer 143 by depositing a dielectric material (e.g., $SiO_x$).

Referring to FIG. 2E, the first semiconductor layer 143 may be etched by an etching process (e.g., a dry etching process) to form a first semiconductor layer 143 having a vertical spacer shape covering the memory layer 150 in the vertical channel hole 103. A portion of the memory layer 150 formed on a bottom surface of the vertical channel hole 103 may be exposed by the spacer etching process. Additionally, the memory layer 150 formed on the ninth insulating layer 110i may also be exposed by the spacer etching process.

Referring to FIG. 2F, the memory layer 150 may be etched to expose a portion of the lower channel 141. For example, the memory layer 150 may be wet-etched or dry-etched to have a vertical shape covering the inner sidewall of the vertical channel hole 103. A portion of the memory layer 150 covering the lower channel 141 may be removed by the etching of the memory layer 150 to expose the lower channel 141. The first semiconductor layer 143 may act as a mask covering the memory layer 150 during the etching process of the memory layer 150, so another portion of the memory layer 150 covering the lower channel 141 may not be removed. As a result, a bottom end portion 150b of the etched memory layer 150 may have an L-shape.

Referring to FIG. 2G, the first semiconductor layer 143 may be removed. For example, the first semiconductor layer 143 may be selectively removed using an etchant. An etch rate of constituents (e.g., SiO2, SiN, SiON) of the memory layer 150 may be greater than an etch rate of a constituent (e.g., poly-crystalline silicon) of the first semiconductor layer 143 during the removal process using the etchant. The etchant may include fluorine (F), chlorine (Cl), bromine (Br), iodine (I), any compound thereof, or any combination thereof. In some embodiments, the etchant may include at least one of $NF_3$, $SF_S$, $Cl_2$, HCL, $CCl_4$, HBr, HI, $ClF_3$, and $CF_3Cl$ which are in a gaseous phase. Since the lower channel 141 is crystalline, it may not be etched while the first semiconductor layer 143 is etched by the etchant.

Referring to FIG. 2H, a second semiconductor layer 145 may be formed to extend along the inner sidewall of the vertical channel hole 103 and to cover the mold stack 10. The second semiconductor layer 145 may be formed of amorphous silicon by a CVD process.

A thermal treatment process may further be performed to convert the amorphous silicon into crystalline silicon. The second semiconductor layer 145 may have a cylindrical shape conformally formed along a profile in the vertical channel hole 103.

As illustrated in FIG. 2I, the second semiconductor layer 145 may have the cylindrical shape which vertically extends along the memory layer 150 in the vertical channel hole 103 and is bent along the bottom end portion 150b of the memory layer 150 having the L-shape on the lower channel 141. Since the second semiconductor layer 145 extends along the memory layer 150 and the lower channel 141 and is bent along the bottom end portion 105b of the memory layer 150, the second semiconductor layer 145 may have a substantially uniform thickness T1 regardless of its formation location. The second semiconductor layer 145 may be in contact with the lower channel 141 so as to be used as an upper channel. The lower channel 141 and the upper channel may constitute a vertical channel 140 which will be described below in FIG. 2L.

Unlike the present embodiment, if the first semiconductor layer 143 is not removed and the second semiconductor layer 145 is then formed as illustrated in FIG. 3A, the first and second semiconductor layers 143 and 145 may be used as an upper channel contacting the lower channel 141. In this case, a sum of thicknesses of the first and second semiconductor layers 143 and 145 may be varied according to their formation location. For example, the first and second semiconductor layers 143 and 145 may have a first thickness T1a on the inner sidewall of the vertical channel hole 103 but may have a second thickness T1b smaller than the first thickness T1a on the bottom end portion 150b of the memory layer 150. The second thickness T1b may be very small according to a deposited thickness of the second semiconductor layer 145. Thus, contact characteristics between the lower channel and the upper channel 143 and 145 may be deteriorated.

According to the present embodiment, since the first semiconductor layer 143 is removed before the formation of the second semiconductor layer 145, the second semiconductor layer 145 may be formed to have the uniform thickness T1, and thus, the contact characteristics between the lower channel 141 and the second semiconductor layer 145 may be excellent.

Referring to FIG. 2J, the second semiconductor layer 145 may be thinly trimmed in some embodiments. For example, the second semiconductor layer 145 may be thinned using a SC1 (standard cleaning 1) solution including ammonia water ($NH_4OH$), hydrogen peroxide ($H_2O_2$), and deionized water.

As illustrated in FIG. 2K, the second semiconductor layer 145 may have a thickness T2 smaller than the initial thickness T1 by the trimming process. In some embodiments, since the second semiconductor layer 145 has the uniform initial thickness T1 as described with reference to FIG. 2I, the second semiconductor layer 145 trimmed may have the uniform thin thickness T2 regardless of its formation location.

Unlike the present embodiment, if the second semiconductor layer 145 formed on the first semiconductor layer 143 is trimmed in the state illustrated in FIG. 3A, the upper channel 143 and 145 may have a first trimmed thickness T2*a* on the inner sidewall of the vertical channel hole 103 and a second trimmed thickness T2*b* on the bottom end portion 150*b* of the memory layer 150. Here, the second trimmed thickness T2*b* may be further smaller than the first trimmed thickness T2*a*. The contact characteristics between the lower channel 141 and the upper channel 143 and 145 may be further deteriorated by the second trimmed thickness T2*b* which becomes further smaller. Further, the lower channel 141 may not be connected to the upper channel 143 and 145.

According to the present embodiment, the second semiconductor layer 145 has the uniform initial thickness T1 as described with reference to FIG. 2I, and thus, the contact characteristics between the lower channel 141 and the second semiconductor layer 145 may be excellent even though the second semiconductor layer 145 is trimmed as illustrated in FIG. 2K.

Referring to FIG. 2L, a filling layer 191 may be formed on the second semiconductor layer 145. For example, a silicon oxide layer or silicon nitride layer may be deposited on the second semiconductor layer 145 to fill the vertical channel hole 103, and the deposited silicon oxide layer or silicon nitride layer and the second semiconductor layer 145 may be planarized until the mold stack 10 is exposed, thereby forming the filling layer 191. Thus, the second semiconductor layer 145 may be formed to have a cylindrical structure having a U-shape in the vertical channel hole 103. The second semiconductor layer 145 having the cylindrical structure is defined as an upper channel 145. The upper channel 145 may surround a sidewall of the filling layer 191 in the vertical channel hole 103. In other words, an inner space of the upper channel 145 having the cylindrical structure may be filled with the filling layer 191. The upper channel 145 may be in contact with the top surface of the lower channel 141. The lower and upper channels 141 and 145 may constitute a vertical channel 140.

According to the present embodiment, the upper channel 145 is formed of a single semiconductor layer (i.e., the second semiconductor layer), so an interface does not exist within the upper channel 145. On the other hand, if the upper channel consists of the first and second semiconductor layers 143 and 145 as illustrated in FIG. 3B, an interface may exist in the upper channel. In this case, a flow of carries or a current may be non-uniform in the upper channel due to the interface. However, since the upper channel 145 according to the present embodiment does not have the interface, a flow of carriers or a current may be substantially uniform in the upper channel 145 of the present embodiment. As a result, the semiconductor memory device according to the inventive concepts may have excellent electrical characteristics.

Referring to FIG. 2M, a word line cut 107 exposing the substrate 101 may be formed between the vertical channels 140. In some embodiments, the mold stack 10 may be dry-etched to form the word line cut 107 penetrating the mold stack 10. The substrate 101 under the word line cut 107 may be recessed by an over-etching. Sidewalls of the sacrificial layers 120 and the insulating layers 110 may be exposed by the word line cut 107.

Referring to FIG. 2N, an etchant may be provided through the word line cut 107 to selectively remove the sacrificial layers 120. A mold wing 15 which includes the insulating layers 110 vertically spaced apart from each other along the vertical channel 140 may be formed by the selective removal of the sacrificial layers 120. For example, if the sacrificial layers 120 are silicon nitride layers and the insulating layers 110 are silicon oxide layers, the etchant may include phosphoric acid ($H_3PO_4$). Recess regions 108 exposing the lower channel 141 and the memory layer 150 may be formed by the selective removal of the sacrificial layers 120. An oxidation process or a deposition process of an insulating material may be performed on the lower channel 141 exposed by the recess region 108 to form a gate insulating layer 113.

Referring to FIG. 2O, gates 160 including first to eighth gates 161 to 168 may be formed to fill the recess regions 108, respectively, thereby forming a gate stack 20 including the gates 161 to 168 vertically spaced apart from each other by the insulating layers 110. A conductive material (e.g., silicon, a metal, a metal nitride, and/or a metal silicide) may be deposited on the substrate 101, and the conductive material outside the recess regions 108 may be then removed to form the gates 161 to 168.

Dopants may be injected into the substrate 101 exposed by the word line cut 107 to form a common source 104*s*. The common source 104*s* may be doped with dopants of a conductivity type different from that of the substrate 101. For example, the substrate 101 may be doped with P-type dopants, and the common source 104*s* may be doped with N-type dopants.

Referring to FIG. 2P, a filling insulating layer 171 may be formed to fill the word line cut 107. For example, an insulating material may be deposited to cover the gate stack 20, and the deposited insulating material may be planarized to form the filling insulating layer 171. A top end portion of the vertical channel 140 may be removed to form an opening 105. The opening 105 may be filled with silicon, and dopants may be injected into the silicon to form a drain 104*d* having the same conductivity type as the common source 104*s*.

Referring to FIG. 2Q, an interlayer insulating layer 173 may be formed to cover the gate stack 20, and a plug 182 may be formed to penetrate the interlayer insulating layer 173. The plug 182 may be connected to the drain 104*d*. A bit line 180 connected to the plug 182 may be formed on the interlayer insulating layer 173. The bit line 180 may be electrically connected to the vertical channel 140 through the plug 182. As a result, a three-dimensional (3D) semiconductor memory device 1, for example, a vertical NAND flash memory device may be formed. The gates 161 to 168 may extend in a first horizontal direction (e.g., a front and back direction) on the substrate 101, and the bit line may extend in a second horizontal direction (e.g., a left and right direction) substantially perpendicular to the first horizontal direction. The gates 161 to 168 vertically stacked along the vertical channel 140 may constitute a cell string.

The first and second gates 161 and 162 of the gates 161 to 168 may be adjacent to the lower channel 141, and the third to eighth gates 163 to 168 may be adjacent to the upper channel 145. The first and second gates 161 and 162 may be non-memory selection gates and may correspond to ground selection lines GSL. The third to sixth gates 163 to 166 may be memory gates and may correspond to word lines WL. The seventh and eighth gates 167 and 168 may be non-memory selection gates and may correspond to string selection lines SSL.

As illustrated in FIG. 2R, the semiconductor memory device 1 according to the present embodiment does not have the memory layer 150 increasing a current path P between the common source 104s and the lower channel 141, so the current path P between common source 104s and the vertical channel 140 may be minimized. In addition, it is possible to suppress an increase of an electrical resistance caused by the increase of the current path P. Since the upper channel 145 has the uniform thickness along the bottom end portion 150b having the L-shape of the memory layer 150 as described with reference to FIGS. 2H to 2K, a region 90 required for a current path from the lower channel 141 to the upper channel 145 may be sufficiently provided even though the upper channel 145 is trimmed. As a result, a body contact 144 of the lower channel 141 and the upper channel 145 may provide a sufficient space or path required for a current flow from the lower channel 141 to the upper channel 145 (or from the upper channel 145 to the lower channel 141), so excellent current flow may be realized between the lower channel 141 and the upper channel 145. The semiconductor memory device 1 may have improved electrical characteristics by the short current path and/or the excellent current flow.

Figure 4A:
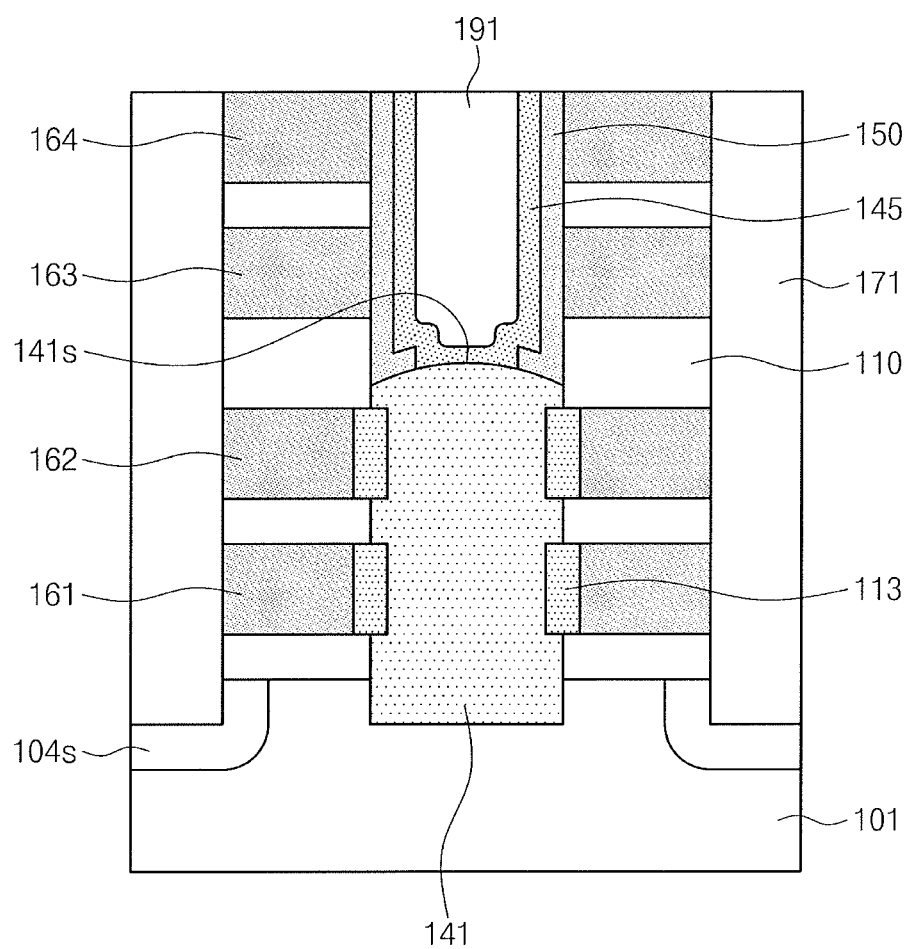
FIGS. 4A to 4C are cross-sectional views illustrating modified embodiments of FIG. 2R.
Figure 4B:
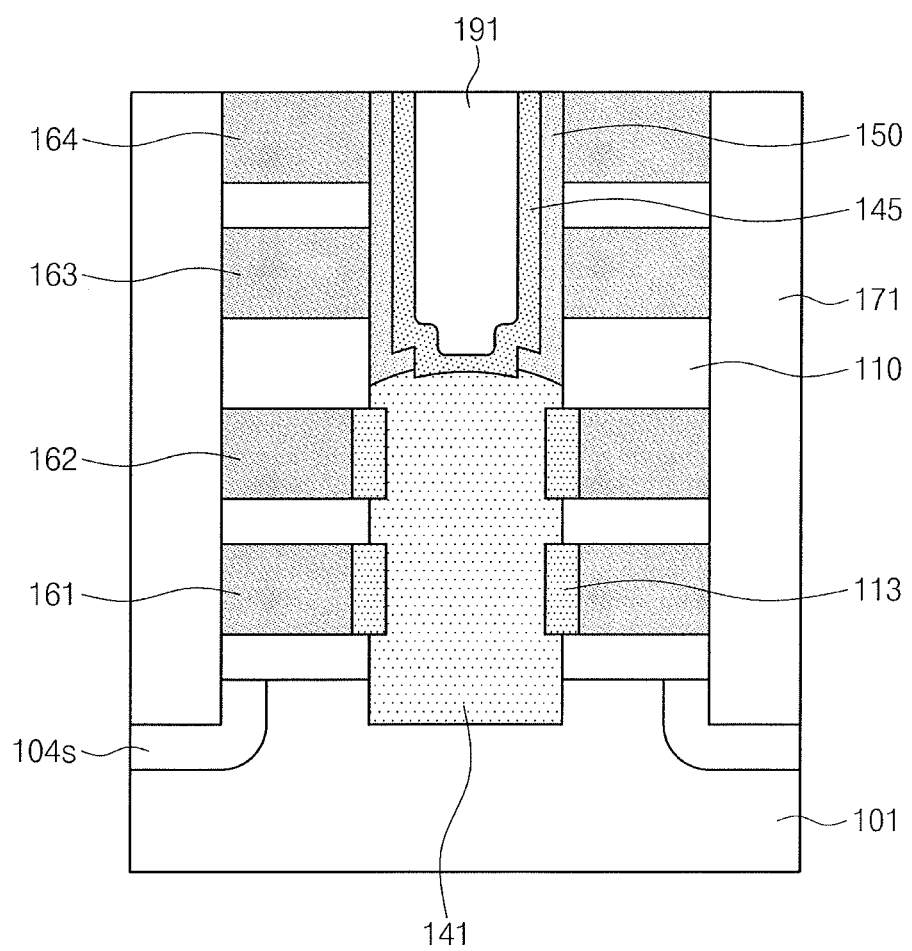
Figure 4C:
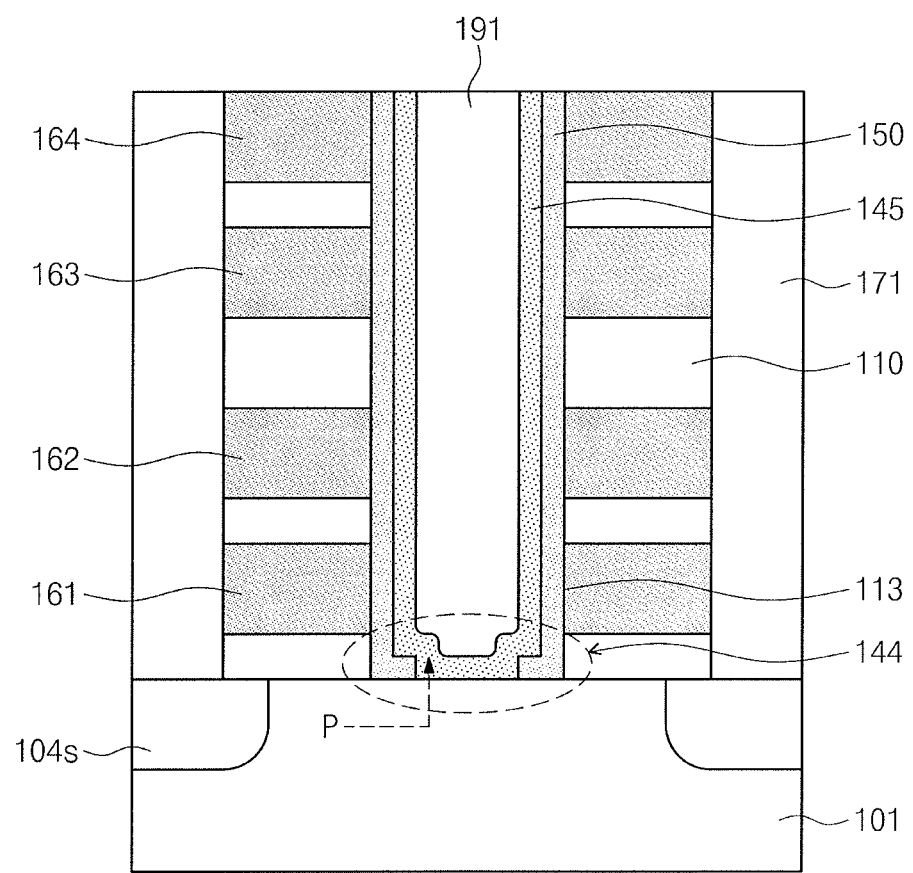

FIGS. 4A to 4C are cross-sectional views illustrating modified embodiments of FIG. 2R.

Referring to FIG. 4A, the lower channel 141 may have a top surface convex toward a direction far away from the substrate 101. For example, if silicon is epitaxially grown from the substrate 101 to form the lower channel 141, the top surface 141s of the lower channel 141 may have the convex shape.

Referring to FIG. 4B, the upper channel 145 may dig into the lower channel 141. For example, a portion of the top surface of the lower channel 141 may also be etched during the process of etching the memory layer 150 to expose the portion of the lower channel 141 as described with reference to FIG. 2F and/or the process of removing the first semiconductor layer 143 as described with reference to FIG. 2G. As a result, the portion of the top surface of the lower channel 141 may be recessed, and a bottom end portion of the upper channel 145 may extend into the recessed region of the top surface of the lower channel 141.

Referring to FIG. 4C, a vertical channel may consist of a second semiconductor layer 145 directly connected to the substrate 101. For example, the formation process of the lower channel 141 described in FIG. 2C may be skipped, and thus, the vertical channel may be formed to consist of only the second semiconductor layer 145. In this case, the second semiconductor layer 145 may be in contact with the substrate 101, so the second semiconductor layer 145 and the substrate 101 may constitute the body contact 144.

FIGS. 5A to 5D are cross-sectional views taken along a line A1-A2 of FIG. 1 to illustrate a method for fabricating a semiconductor memory device according to other embodiments of the inventive concepts. FIG. 5E is an enlarged cross sectional view of a portion of FIG. 5D.

Figure 5A:
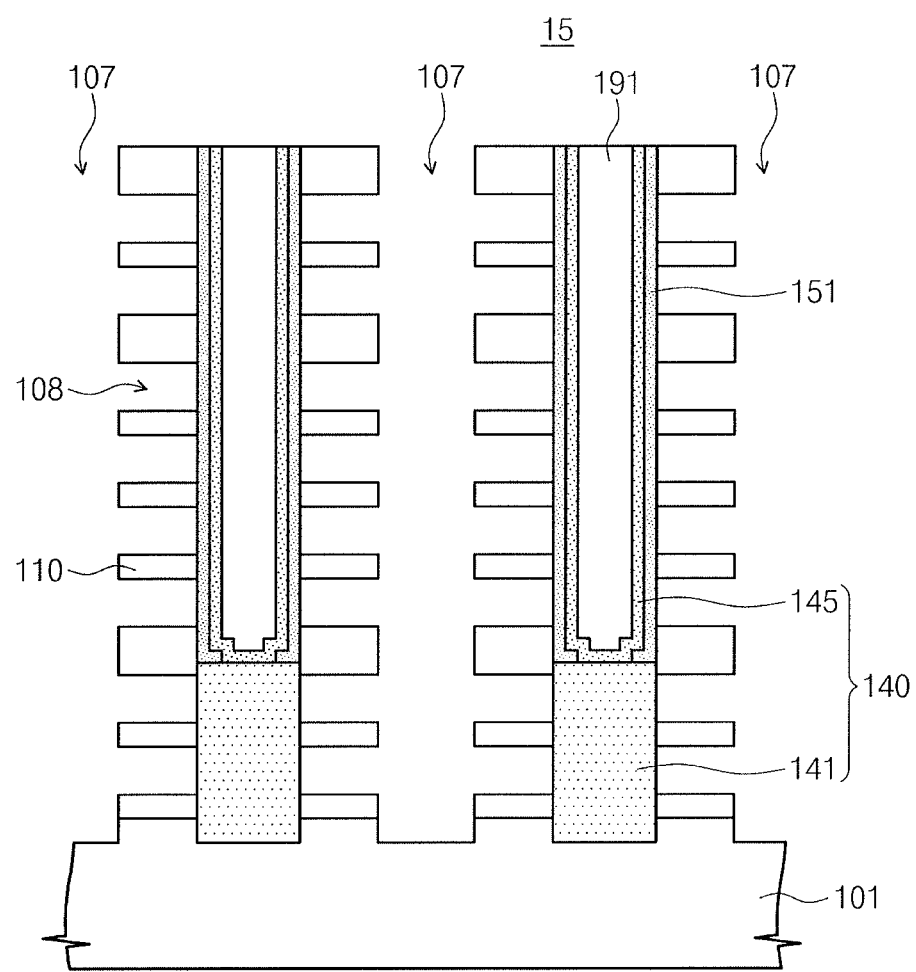
FIGS. 5A to 5D are cross-sectional views taken along a line A1-A2 of FIG. 1 to illustrate a method for fabricating a semiconductor memory device according to other embodiments of the inventive concepts.

Referring to FIG. 5A, the mold wing 15 may be formed by processes which are the same as or similar to those described with reference to FIGS. 2A to 2N. According to the present embodiment, a first memory layer 151 may be formed to surround the upper channel 145. The first memory layer 151 may include a tunnel insulating layer, or the tunnel insulating layer and a trap insulating layer. In the present embodiment, the gate insulating layer 113 of FIG. 2N on the sidewall of the lower channel 141 may be omitted.

Figure 5B:
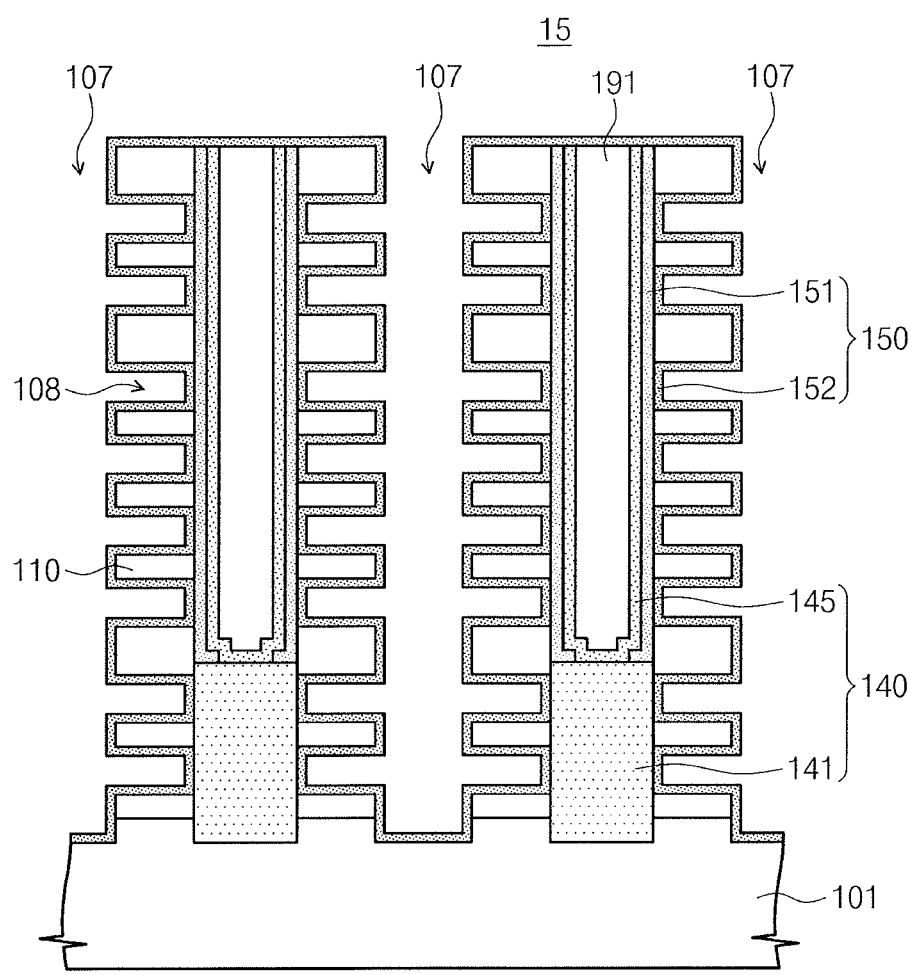

Referring to FIG. 5B, a second memory layer 152 may be formed to cover inner surfaces of the recess regions 108. If the first memory layer 151 includes the tunnel insulating layer, the second memory layer 152 may include the trap insulating layer and the blocking insulating layer. In other embodiments, if the first memory layer 151 includes the tunnel insulating layer and the trap insulating layer, the second memory layer 152 may include the blocking insulating layer. The first and second memory layers 151 and 152 may constitute the memory layer 150.

Figure 5C:
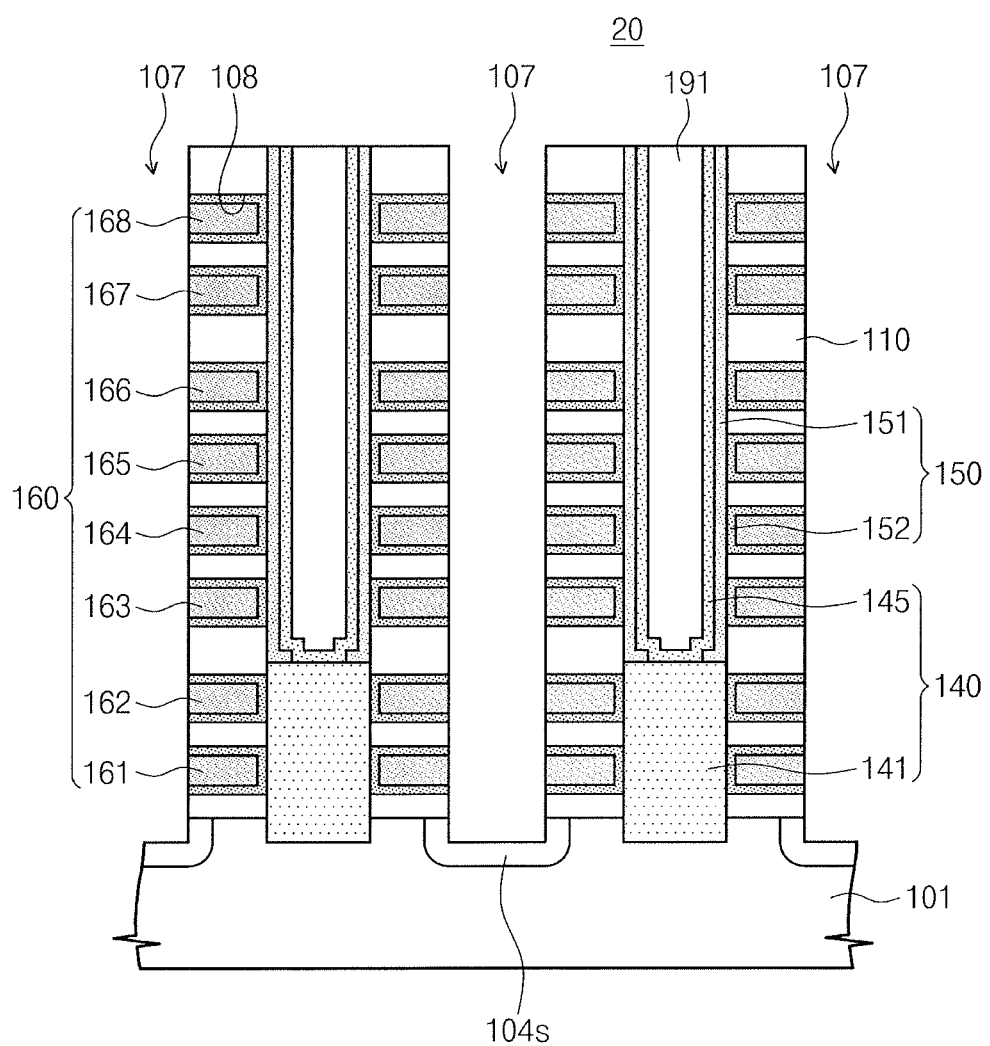

Referring to FIG. 5C, the gates 160 including the first to eighth gates 161 to 168 may be formed in the recess regions 108 by a deposition process and an etching process of a conductive material. Thus, the gate stack 20 may be formed. The gate stack 20 may include the gates 160 vertically stacked along the vertical channel 140 on the substrate 101. Dopants may be injected into the substrate 101 exposed through the word line cut 107 to form the common source 104s.

Figure 5D:
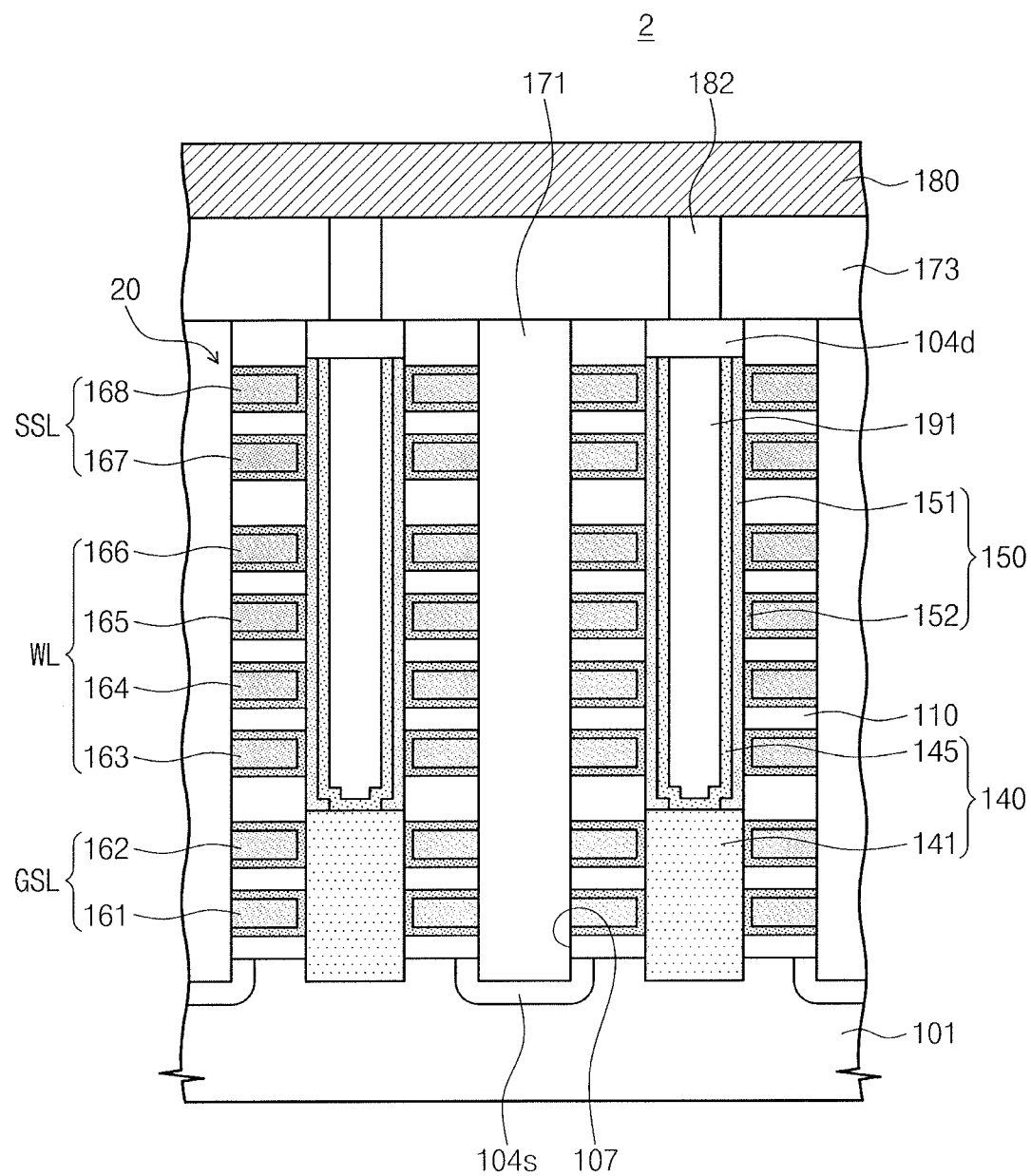
Figure 5E:
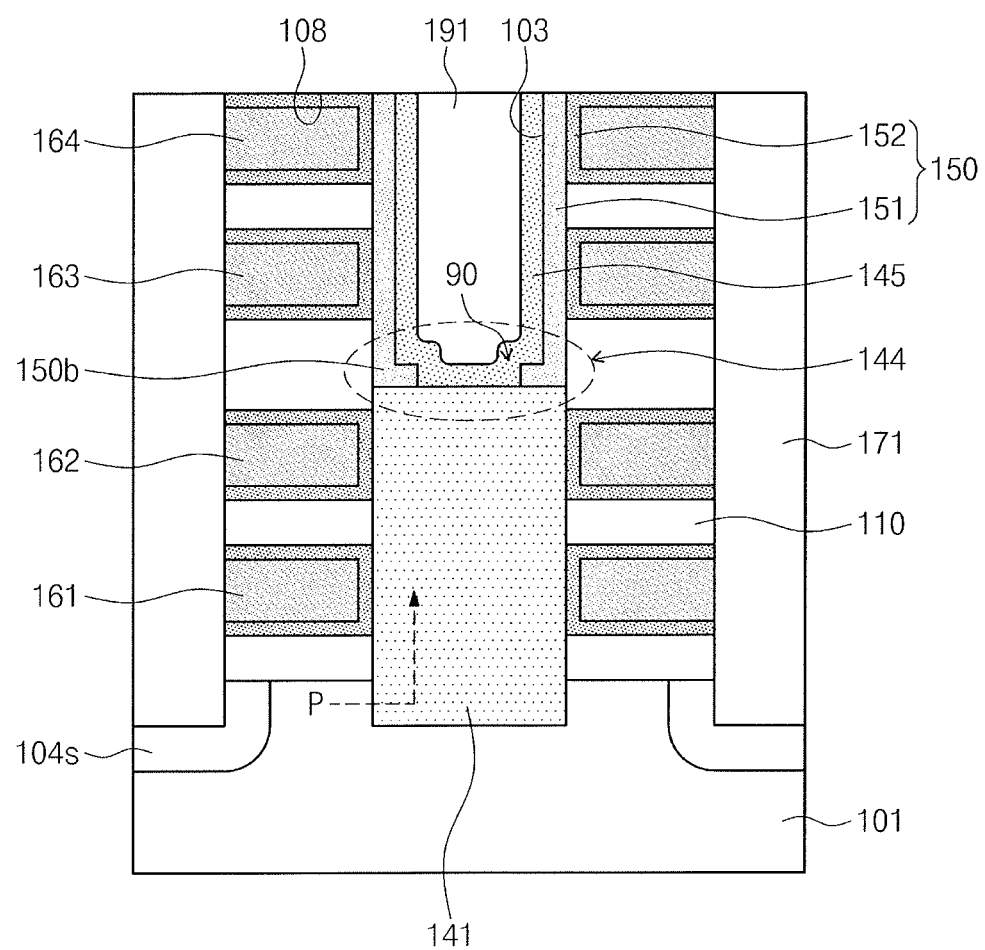
FIG. 5E is an enlarged cross sectional view of a portion of FIG. 5D.

Referring to FIG. 5D, the filling insulating layer 171, the interlayer insulating layer 173, the plug 182, and the bit line 180 may be formed by processes which are the same as or similar to those described with reference to FIGS. 2P and 2Q. The filling insulating layer 171 may fill the word line cut 107, and the interlayer insulating layer 173 may cover the gate stack 20. The plug 182 may penetrate the interlayer insulating layer 173 so as to be connected to the drain 104d. The bit line 180 may be disposed on the interlayer insulating layer 173 and may be electrically connected to the vertical channel 140 through the plug 182. As a result, a 3D semiconductor memory device 2, for example, a vertical NAND flash memory device may be formed. A planar structure of the semiconductor memory device 2 may be the same as or similar to that of the semiconductor memory device 1 of FIG. 1.

According to the present embodiment, the memory layer 150 may include the first memory layer 151 formed in the vertical channel hole 103 and the second memory layer 152 formed in the recess region 108. Other features of the semiconductor memory device 2 may be the same as corresponding features of the semiconductor memory device 1 of FIGS. 2Q and 2R.

Figure 6A:
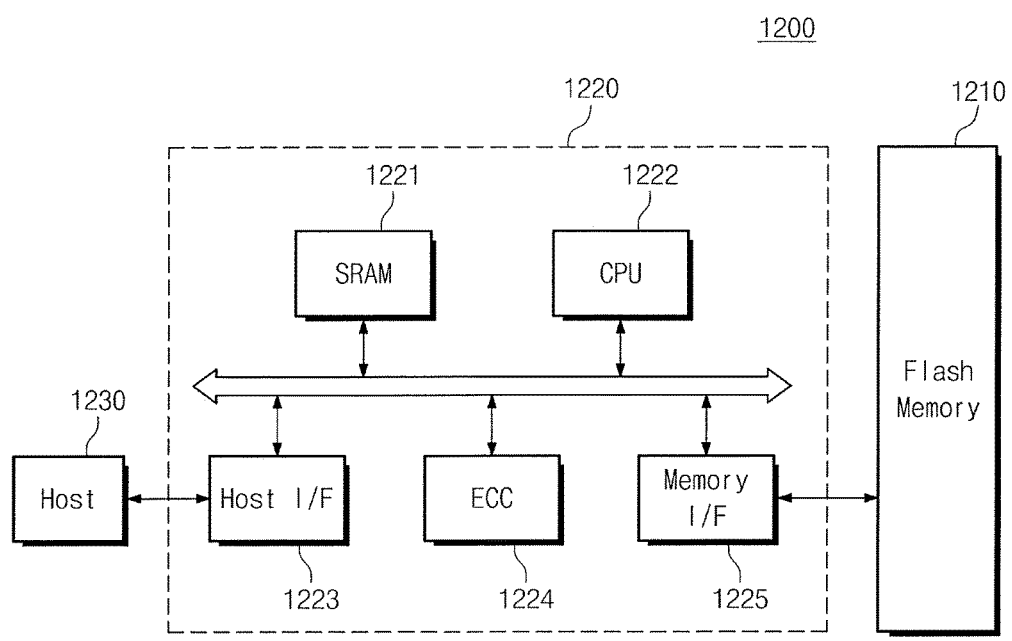
FIG. 6A is a schematic block diagram illustrating a memory card including a semiconductor memory device according to embodiments of the inventive concepts.
Figure 6B:
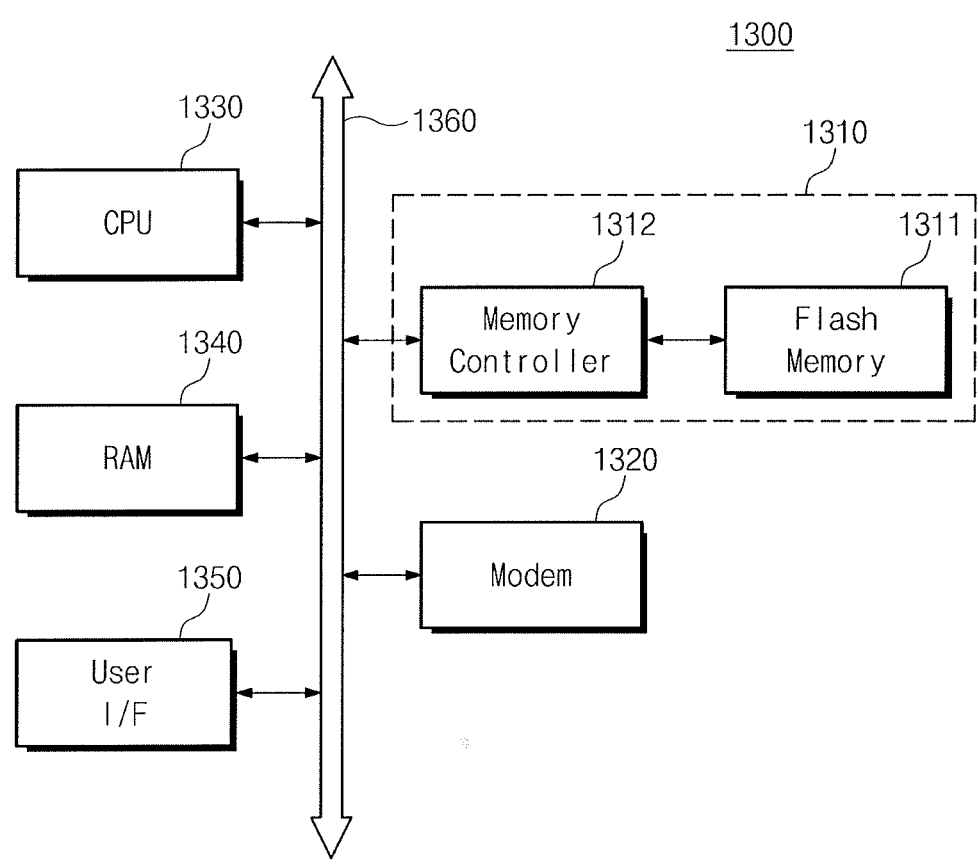
FIG. 6B is a schematic block diagram illustrating an information processing system including a semiconductor memory device according to embodiments of the inventive concepts.

FIG. 6A is a schematic block diagram illustrating a memory card including a semiconductor memory device according to embodiments of the inventive concepts. FIG. 6B is a schematic block diagram illustrating an information processing system including a semiconductor memory device according to embodiments of the inventive concepts.

Referring to FIG. 6A, a flash memory 1210 may include at least one of the semiconductor memory devices 1 and 2 according to the aforementioned embodiments of the inventive concepts. The flash memory 1210 may applied to a memory card 1200. For example, the memory card 1200 may include a memory controller 1220 that controls data communication between a host 1230 and the flash memory 1210. A static random access memory (SRAM) device 1221 may be used as a working memory of a central processing unit (CPU) 1222. A host interface unit 1223 may be configured to include a data communication protocol between the memory card 1200 and the host 1230. An error check and correction (ECC) block 1224 may detect and correct errors of data which are read out from the memory device 1210. A memory interface unit 1225 may interface with the memory device 1210. The CPU 1222 controls overall operations of the memory controller 1220.

Referring to FIG. 6B, an information processing system 1300 may include a memory system 1310 including at least one of the semiconductor memory devices 1 and 2 according to embodiments of the inventive concepts. The information processing system 1300 may include a mobile device or a computer. For example, the information processing system 1300 may include a modem 1320, a central processing unit (CPU) 1330, a random access memory (RAM) 1340, and a user interface unit 1350 that are electrically connected to the memory system 1310 through a system bus 1360. The memory system 1310 may include a flash memory 1311 and a memory controller 1312. The memory system 1310 may have substantially the same structure as the memory card 1200 illustrated FIG. 6A. The memory system 1310 may store data processed by the CPU 1330 or data inputted from an external system. The information processing system 1300 may be realized as a memory card, a solid state disk (SSD) device, a camera image sensor, and another type of application chipset. For example, if the memory system 1310 may be realized as the SSD device, the information processing system 1300 may stably and reliably store massive data.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor memory device, comprising:
    a substrate having a plurality of gates arranged in a vertical stack;
    a channel hole vertically penetrating the plurality of gates, the channel hole having an upper region and a lower region, the upper region including an upper sidewall of the channel hole, and the lower region including a lower sidewall of the channel hole;
    a memory layer vertically extending on the upper and lower sidewalls of the channel hole; and
    a vertical channel in the channel hole, the vertical channel including:
    a lower channel filling the lower region of the channel hole and electrically connected to the substrate; and
    an upper channel in the upper region of the channel hole, and
    wherein:
    the memory layer vertically extends along the upper sidewall of the channel hole and horizontally extends along part of a top surface of the lower channel so as to include a bottom end portion having an L-shape,
    the upper channel has a first portion that extends along and directly contacts the memory layer in the upper region of the channel hole and has a second portion that extends along and directly contacts the top surface of the lower channel,
    the first portion of the upper channel is longer than a distance between a top surface and a bottom surface of at least one of the plurality of gates, and
    the upper channel is a single layer conformally formed such that the first portion and the second portion of the upper channel have a uniform thickness to one another.

2. The semiconductor memory device of claim 1, wherein the top surface of the lower channel is flat or convex toward a direction far away from the substrate.

3. The semiconductor memory device of claim 1, wherein the upper channel extends crookedly along the L-shape of the bottom end portion of the memory layer.

4. The semiconductor memory device of claim 1, wherein a portion of the top surface of the lower channel is recessed, and
    wherein a bottom end portion of the upper channel is disposed in the recessed region of the top surface of the lower channel.

5. The semiconductor memory device of claim 1, wherein the lower channel has a pillar-shape completely filling the lower region of the channel hole, and
    wherein the upper channel has a U-shaped cylindrical structure partially filling the upper region of the channel hole.

6. The semiconductor memory device of claim 5, further comprising:
    an insulating filling layer filling an inner space of the cylindrical structure of the upper channel.

7. The semiconductor memory device of claim 1, wherein the memory layer is provided between the upper channel and the gates adjacent to the upper channel, and
    wherein a gate insulating layer is provided between the lower channel and the gates adjacent to the lower channel.

8. The semiconductor memory device of claim 1, wherein the substrate under the lower channel is recessed, and
    wherein a bottom end portion of the lower channel is disposed in the recessed region of the substrate.

9. A semiconductor memory device comprising:
    a gate stack including at least one lower non-memory gate, a plurality of memory gates, and at least one upper non-memory gate that are vertically stacked on a substrate;
    an upper channel vertically penetrating the at least one upper non-memory gate and the plurality of memory gates;
    a lower channel vertically penetrating the at least one lower non-memory gate; and
    a memory layer provided between the upper channel and the at least one upper non-memory gate and between the upper channel and the plurality of memory gates,
    wherein the memory layer has an L-shaped bottom end portion contacting the lower channel and an upper portion extending vertically from the L-shaped bottom end portion, and
    wherein the upper channel has a first portion that extends along and directly contacts the upper portion of the memory layer and a second portion that extends along and directly contacts a top surface of the lower channel, the upper channel being conformally formed such that the first portion and the second portion of the upper channel have a uniform thickness to one another.

10. The semiconductor memory device of claim 9, wherein a lower portion of the upper channel has a crooked shape extending along the L-shaped bottom end portion of the memory layer.

11. The semiconductor memory device of claim 10, wherein the memory layer is not provided between the lower channel and the at least one lower non-memory gate.

12. The semiconductor memory device of claim 10, wherein the memory layer comprises:
    a first memory layer provided between the upper channel and the at least one upper non-memory gate and between the upper channel and the plurality of memory gates; and
    a second memory layer provided between the lower channel and the at least one lower non-memory gate,
    wherein the second memory layer is further provided between the first memory layer and the at least one upper non-memory gate and between the first memory layer and the plurality of memory gates.

13. The semiconductor memory device of claim 9, wherein the upper channel and the lower channel are connected to each other to constitute a vertical channel vertically penetrating the gate stack, and
wherein the vertical channel is electrically connected to the substrate.

14. The semiconductor memory device of claim 13, wherein the vertical channel fills a channel hole vertically penetrating the gate stack,
wherein the lower channel has a pillar-shape completely filling a lower region of the channel hole,
wherein the upper channel is a single layer having a cylindrical shape that continuously extends along an inner sidewall of an upper region of the channel hole and the top surface of the lower channel, and
wherein an inner space of the cylindrical shape is filled with an insulating layer.

15. A method for fabricating a semiconductor memory device, the method comprising:
forming a channel hole vertically penetrating a plurality of layers stacked on a substrate, the channel hole exposing the substrate;
forming a lower channel partially filling the channel hole;
forming a memory layer extending along an inner sidewall of the channel hole and a top surface of the lower channel;
forming a semiconductor spacer layer vertically extending along the inner sidewall of the channel hole on the memory layer;
etching the memory layer to expose a portion of the top surface of the lower channel by an etching process using the semiconductor spacer layer as an etch mask, the etched memory layer directly contacting and covering another portion of the top surface of the lower channel;
removing the entire semiconductor spacer layer to expose the etched memory layer after the etching; and
forming an upper channel extending along the exposed memory layer and the exposed portion of the top surface of the lower channel.

16. The method of claim 15, wherein removing the semiconductor spacer layer comprises:
selectively removing the semiconductor spacer layer by providing a gaseous etchant capable of selectively etching the semiconductor spacer layer with respect to the memory layer.

17. The method of claim 16, wherein the memory layer includes an insulating layer, and
wherein the gaseous etchant includes fluorine (F), chlorine (Cl), bromine (Br), iodine (I), any compound thereof, or any combination thereof.

18. The method of claim 15, further comprising:
trimming the upper channel.

19. The method of claim 18, wherein trimming the upper channel comprises:
thinning the upper channel by providing a solution including ammonia water ($NH_4OH$), hydrogen peroxide ($H_2O_2$), and deionized water.

* * * * *